United States Patent
Niebojewski et al.

(10) Patent No.: US 12,376,350 B2
(45) Date of Patent: Jul. 29, 2025

(54) METHOD FOR MANUFACTURING A QUANTUM ELECTRONIC CIRCUIT

(71) Applicant: COMMISSARIAT À L'ENERGIE ATOMIQUE ET AUX ENERGIES ALTERNATIVES, Paris (FR)

(72) Inventors: Heimanu Niebojewski, Grenoble (FR); Thomas Bedecarrats, Grenoble (FR); Benoit Bertrand, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 503 days.

(21) Appl. No.: 17/957,687

(22) Filed: Sep. 30, 2022

(65) Prior Publication Data

US 2023/0105807 A1 Apr. 6, 2023

(30) Foreign Application Priority Data

Oct. 1, 2021 (FR) ........................ 2110390

(51) Int. Cl.
H10D 48/00 (2025.01)
G06N 10/40 (2022.01)

(52) U.S. Cl.
CPC ........... H10D 48/383 (2025.01); G06N 10/40 (2022.01)

(58) Field of Classification Search
CPC .............. H10D 48/383; H10D 30/014; H10D 48/3835; H10D 64/27; H10D 62/122; H10D 84/00; G06N 10/40; G06N 10/70; B82Y 10/00
See application file for complete search history.

(56) References Cited

U.S. PATENT DOCUMENTS

| | | | |
|---|---|---|---|
| 6,770,916 B2* | 8/2004 | Ohshima | H10D 30/402 257/14 |
| 9,159,739 B2 | 10/2015 | Makala et al. | |
| 9,853,102 B2 | 12/2017 | Tsai et al. | |
| 10,522,669 B2* | 12/2019 | Barraud | H10D 48/031 |
| 2008/0031296 A1* | 2/2008 | Spillane | B82Y 10/00 385/24 |
| 2021/0296556 A1 | 9/2021 | Hsu et al. | |

FOREIGN PATENT DOCUMENTS

| | | |
|---|---|---|
| EP | 3 401 848 A1 | 11/2018 |
| EP | 3 660 921 A1 | 6/2020 |
| FR | 3 066 297 A1 | 11/2018 |

OTHER PUBLICATIONS

Search Report as issued in French Patent Application No. 2110390, dated May 19, 2022.
Li, R., et al., "A Crossbar Network for Silicon Quantum Dot Qubits," Science Advances, vol. 4, No. 7, Jul. 2018, 24 pages.
Veldhorst, M., et al., "Silicon CMOS architecture for a spin-based quantum computer," nature communications, 8, 1766, Dec. 2017.

* cited by examiner

*Primary Examiner* — Syed I Gheyas
(74) *Attorney, Agent, or Firm* — Pillsbury Winthrop Shaw Pittman LLP

(57) ABSTRACT

A method for manufacturing a quantum electronic circuit includes etching a semiconducting layer so as to obtain: a plurality of pillars; and a qubit layer; oxidising the flank of each pillar; forming coupling rows and coupling columns; and depositing separation layers leaving a contact surface protrude from each pillar.

14 Claims, 19 Drawing Sheets

[Fig. 1]
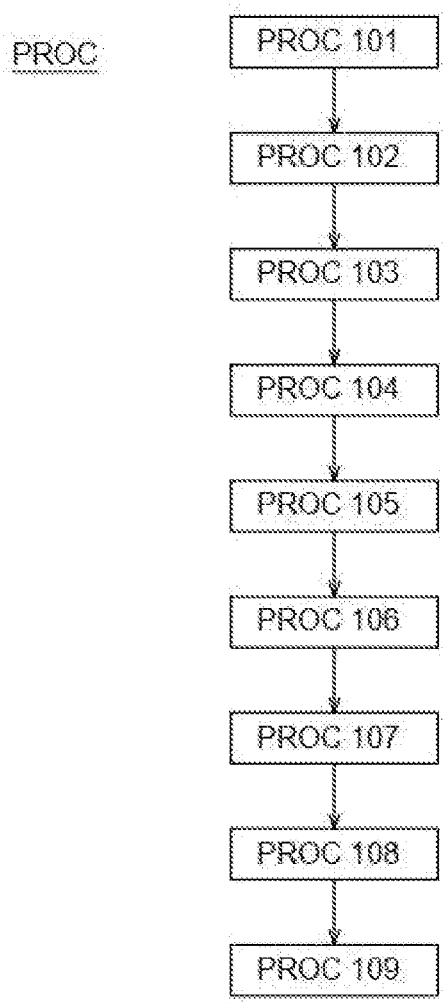
[Fig. 2]
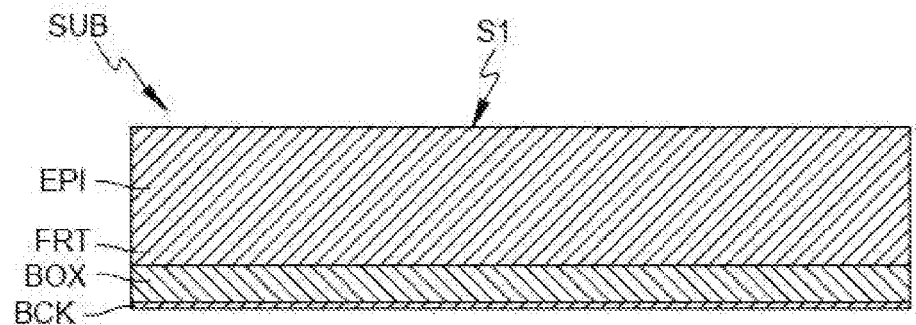

[Fig. 3]
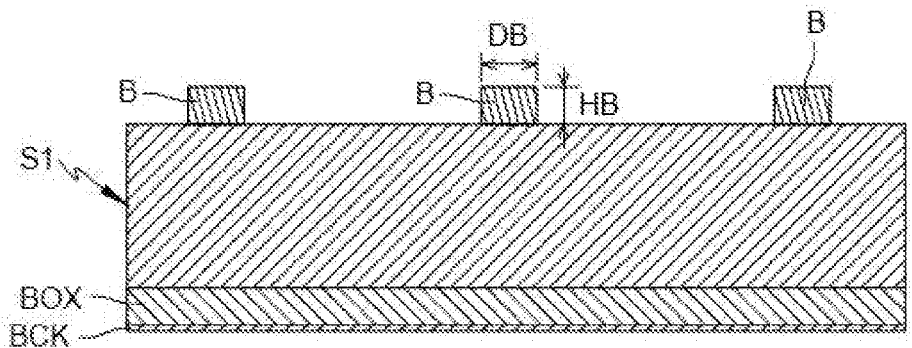
[Fig. 4a]
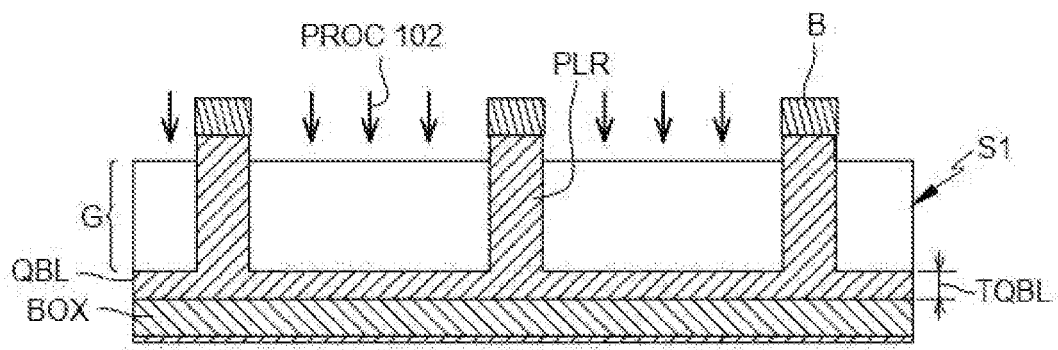
[Fig. 4b]
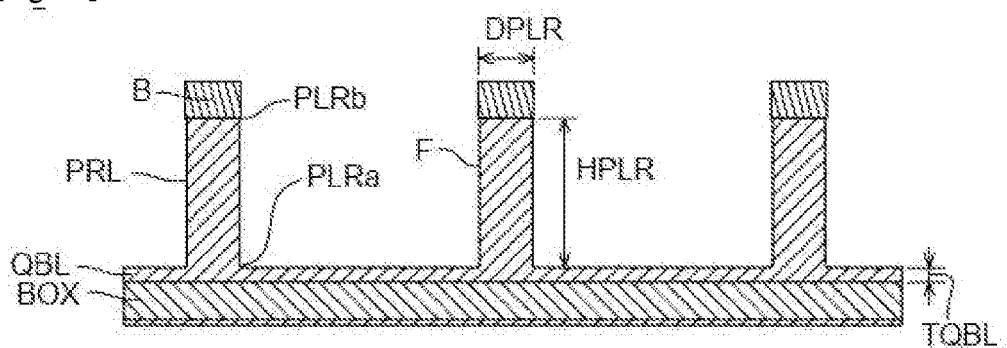
[Fig. 5a]
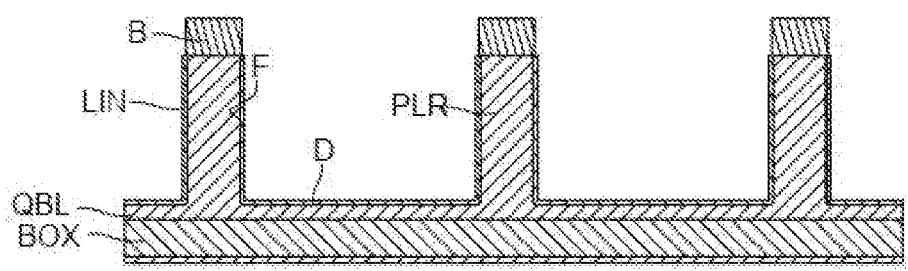

[Fig. 5b]
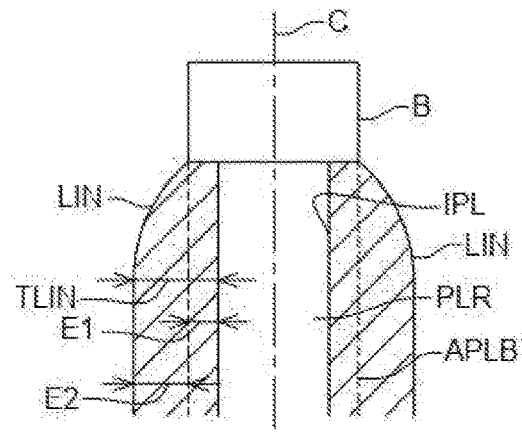
[Fig. 5c]
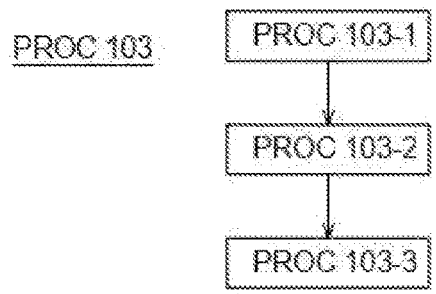
[Fig. 5d]
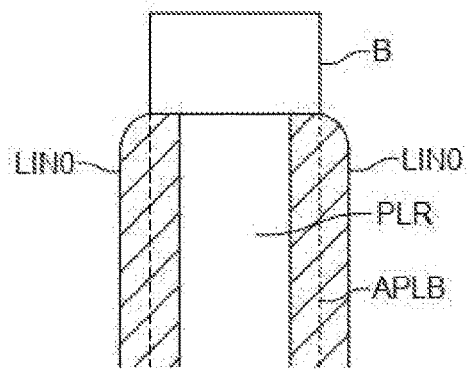
[Fig. 5e]
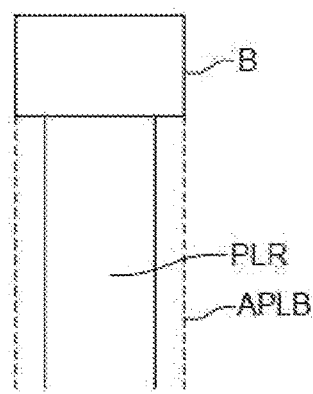

[Fig. 5f]
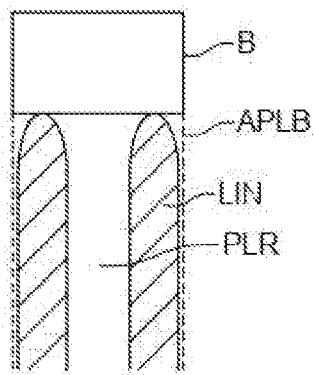
[Fig. 6a]
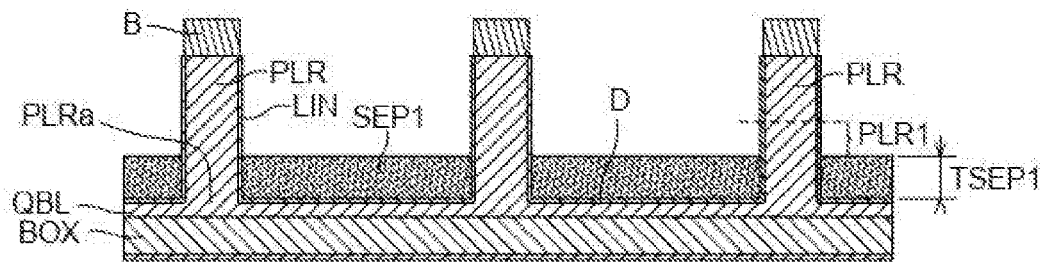
[Fig. 6b]
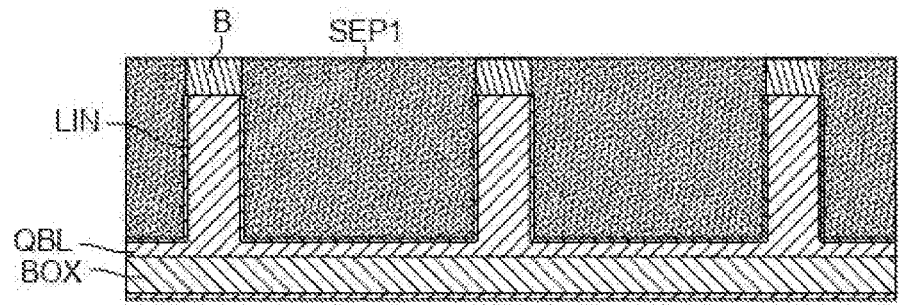
[Fig. 7a]
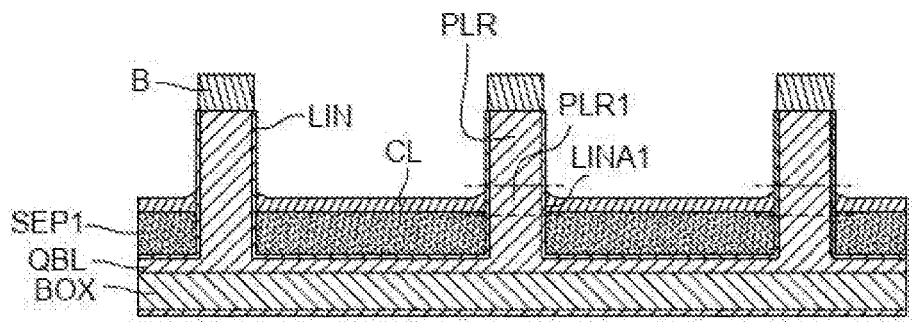

[Fig. 7b]
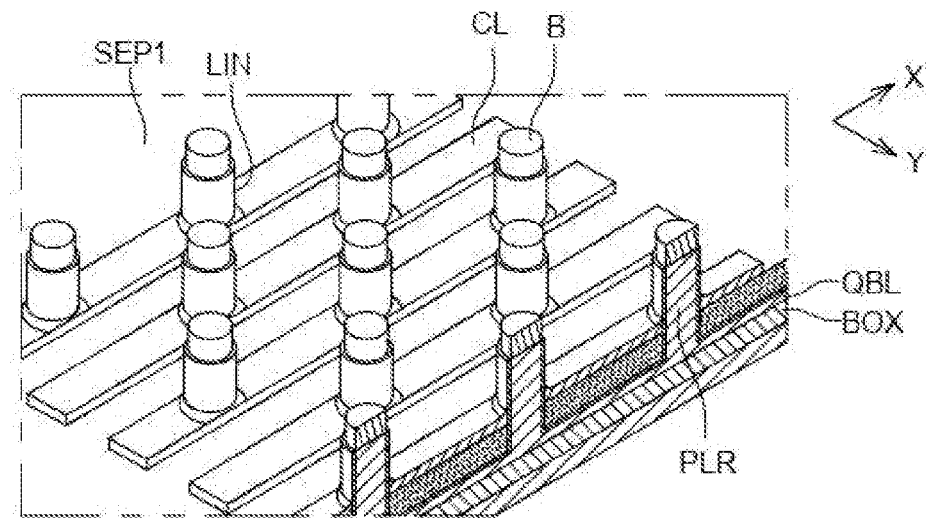
[Fig. 7c]
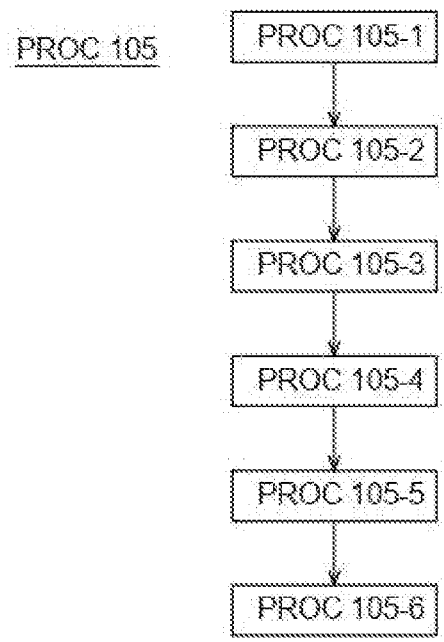

[Fig. 7d]
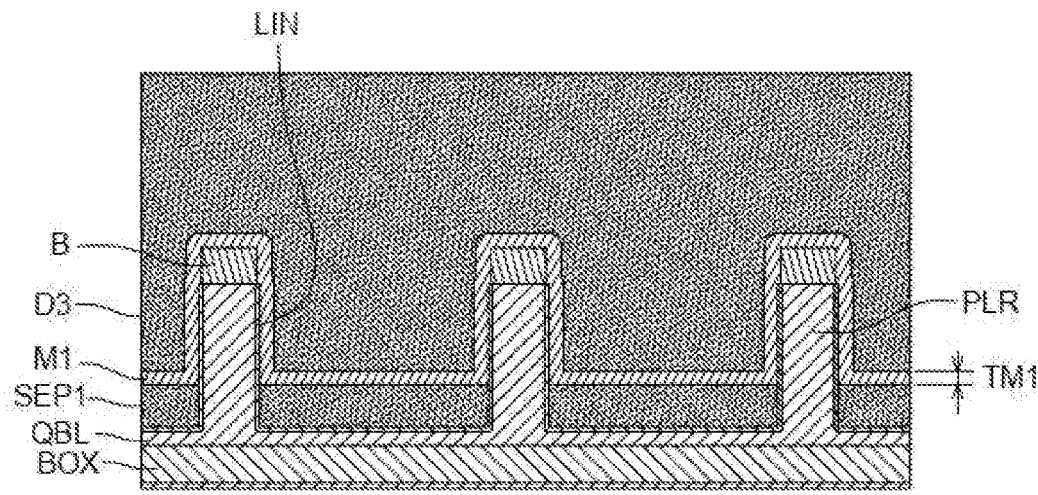
[Fig. 7e]
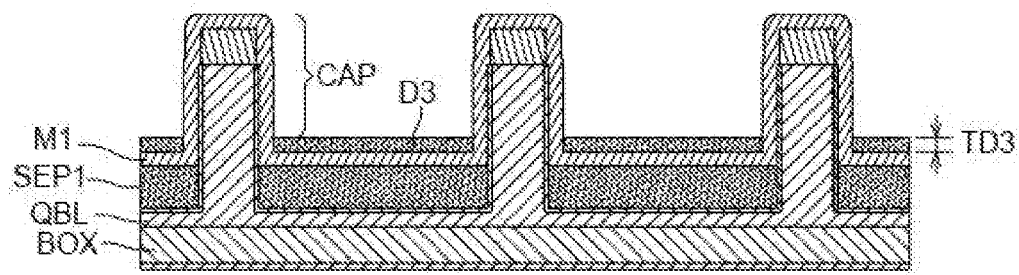
[Fig. 7f]
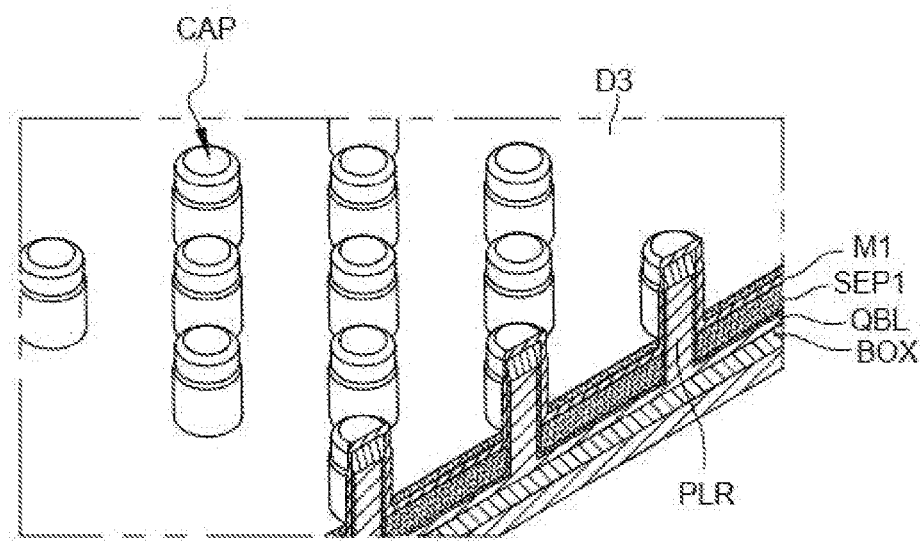

[Fig. 7g]
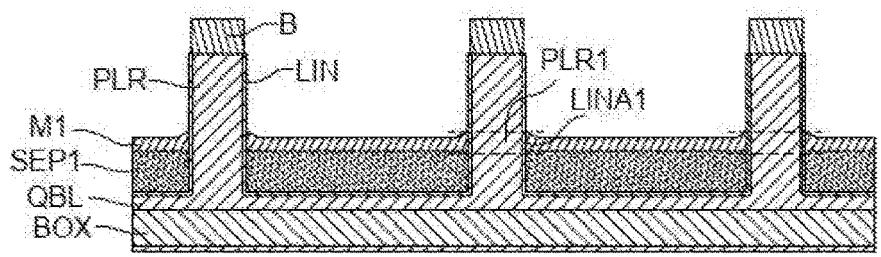
[Fig. 7h]
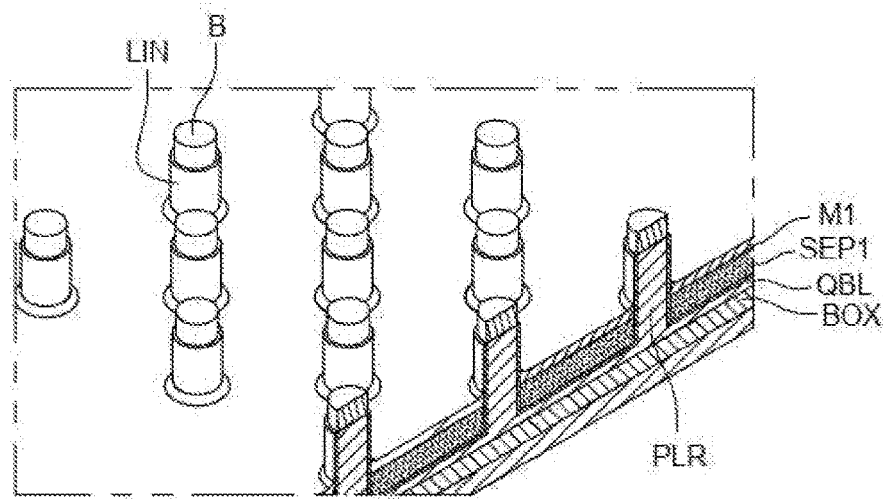
[Fig. 8]
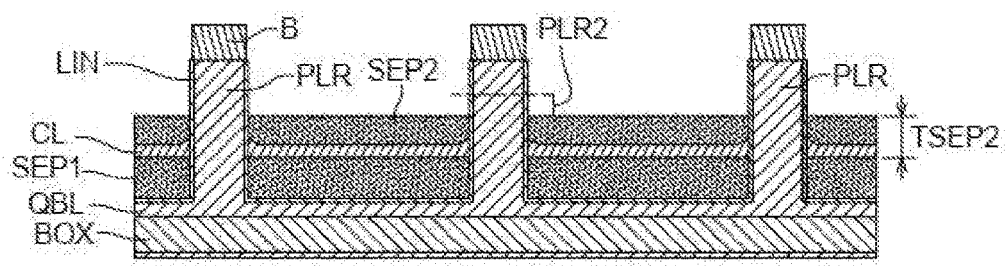
[Fig. 9a]
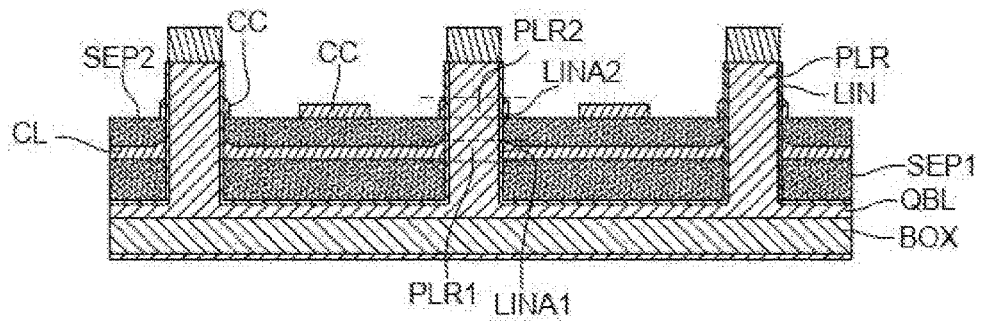

[Fig. 9b]
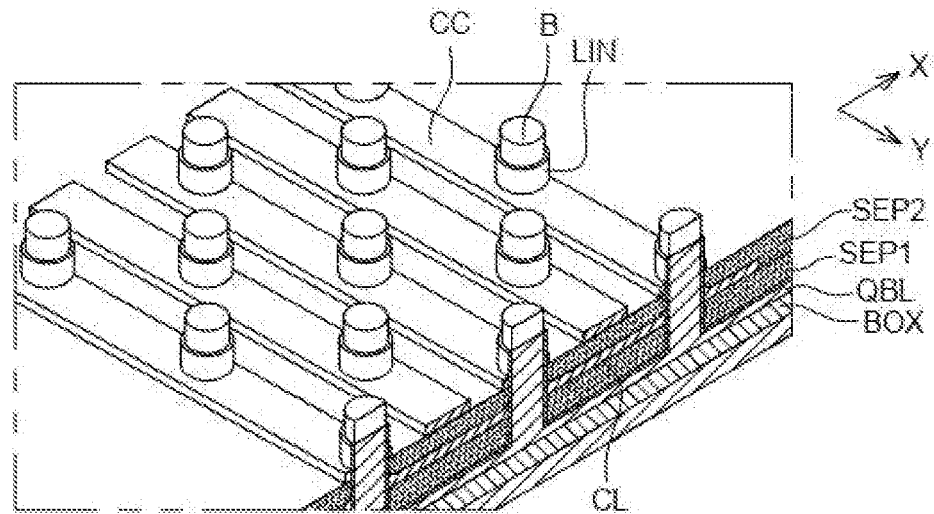
[Fig. 10a]
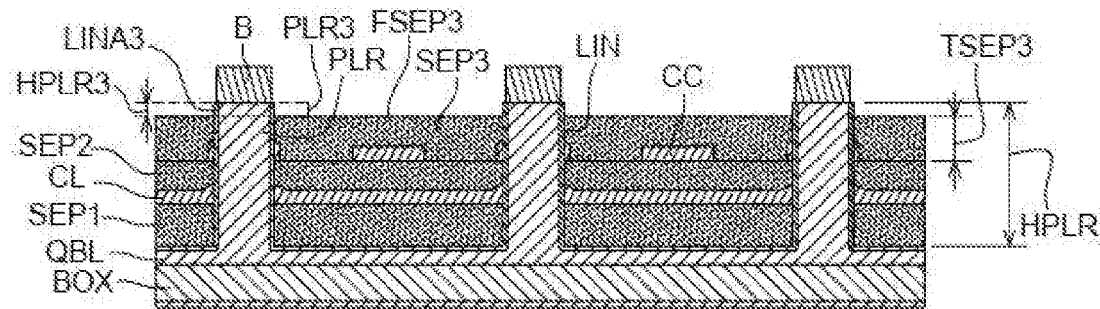
[Fig. 10b]
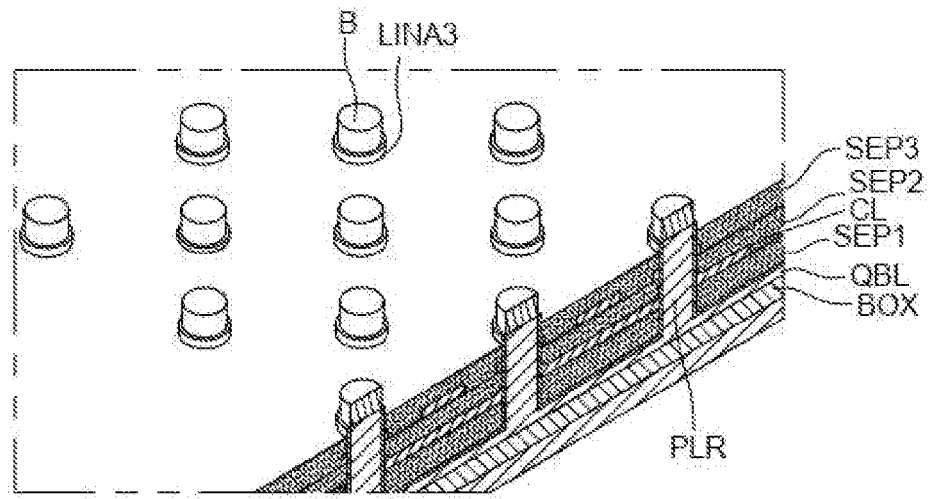

[Fig. 11a]
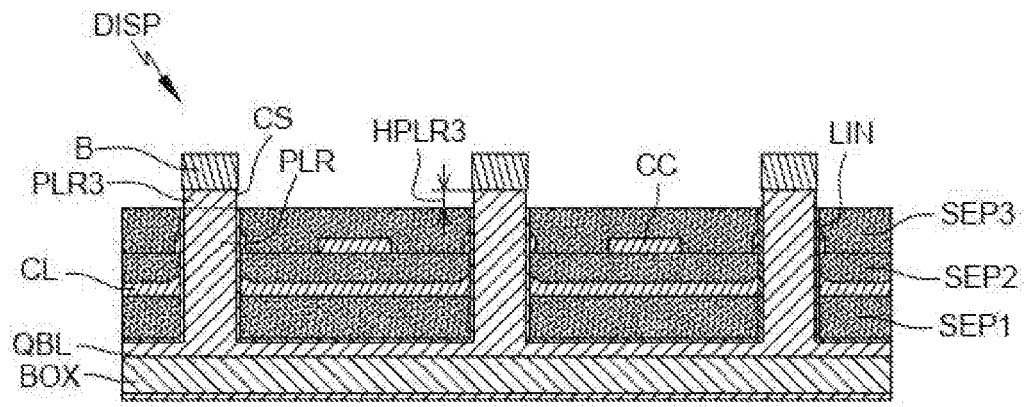
[Fig. 11b]
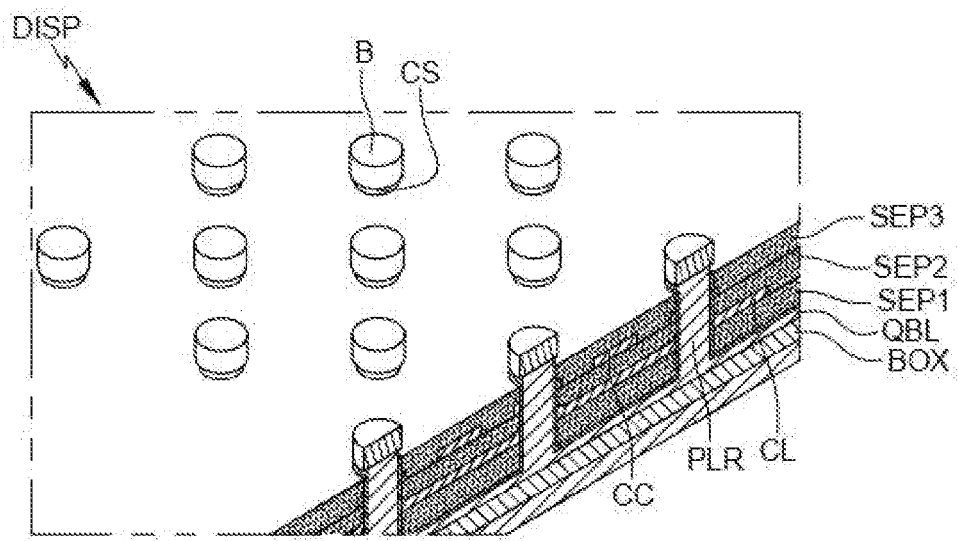
[Fig. 12]
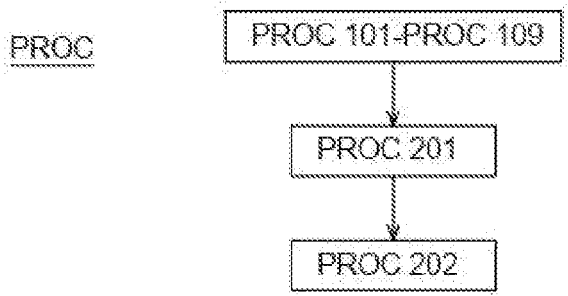

[Fig. 13]
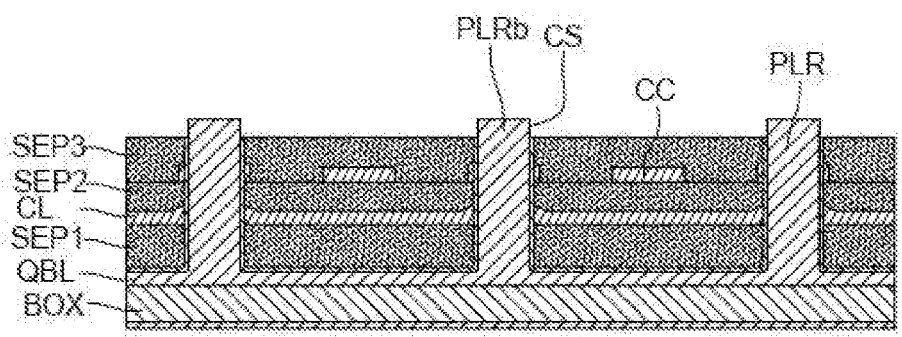
[Fig. 14]
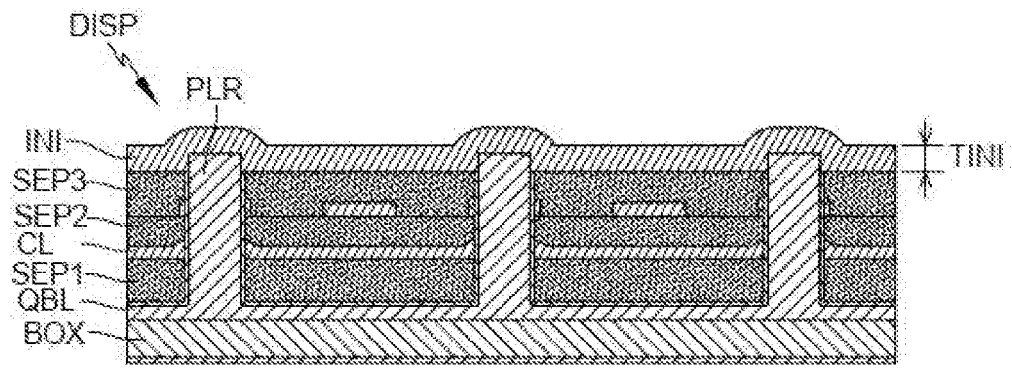

[Fig. 15]
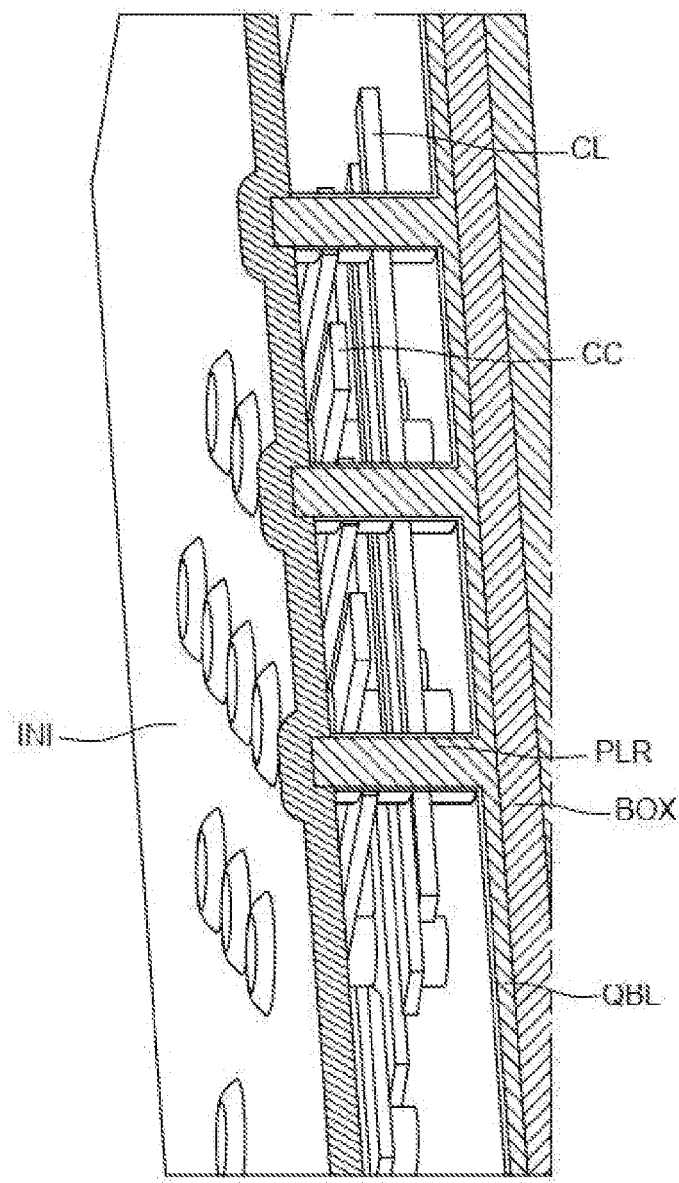

[Fig. 16]
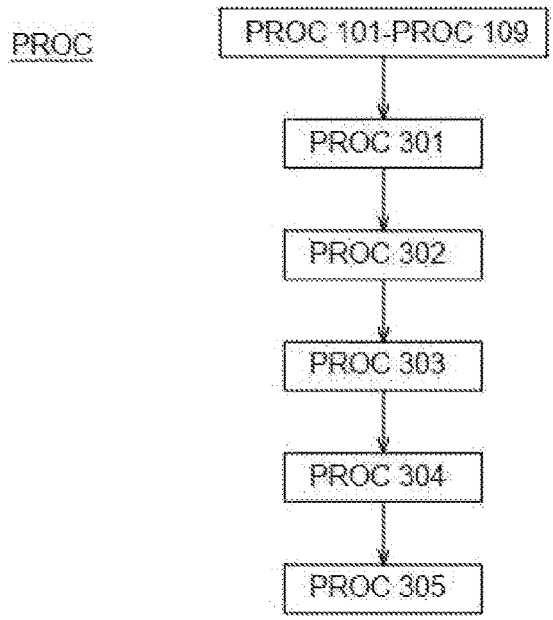
[Fig. 17a]
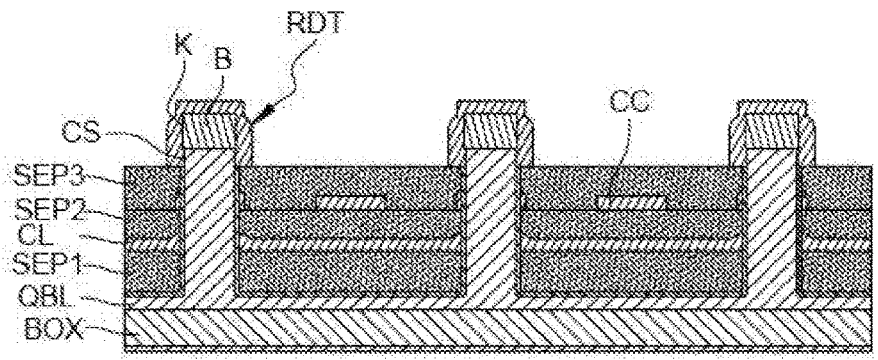
[Fig. 17b]
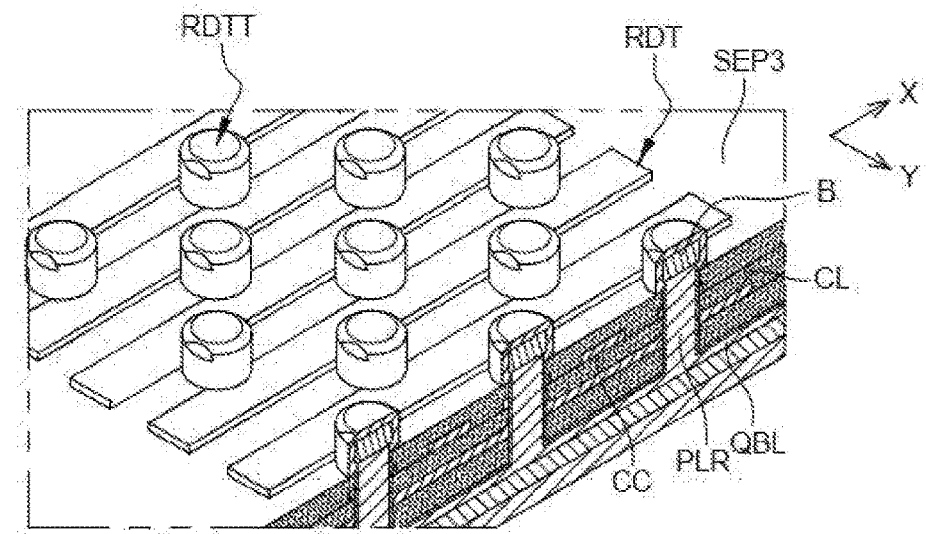

[Fig. 17c]
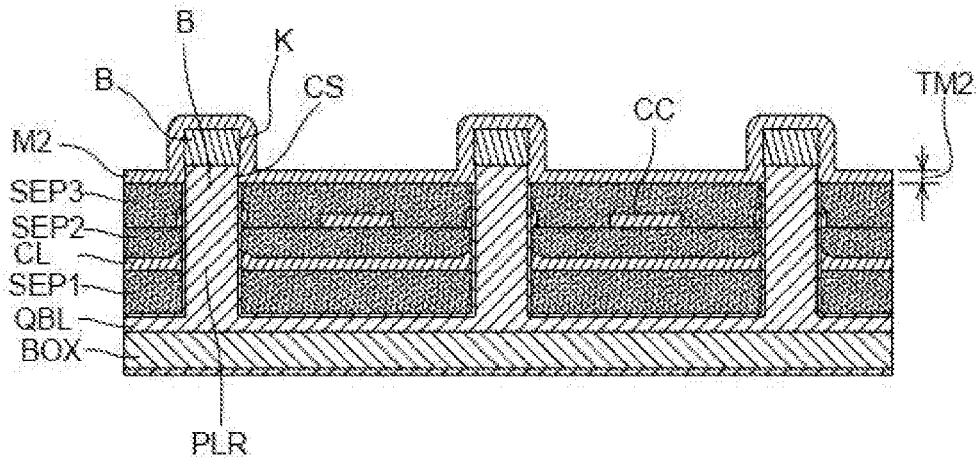
[Fig. 17d]
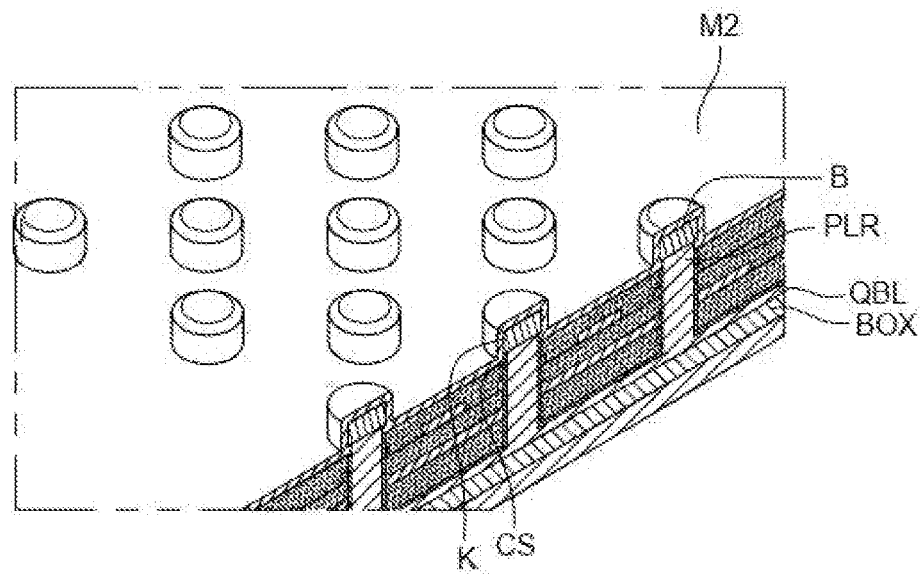
[Fig. 18a]
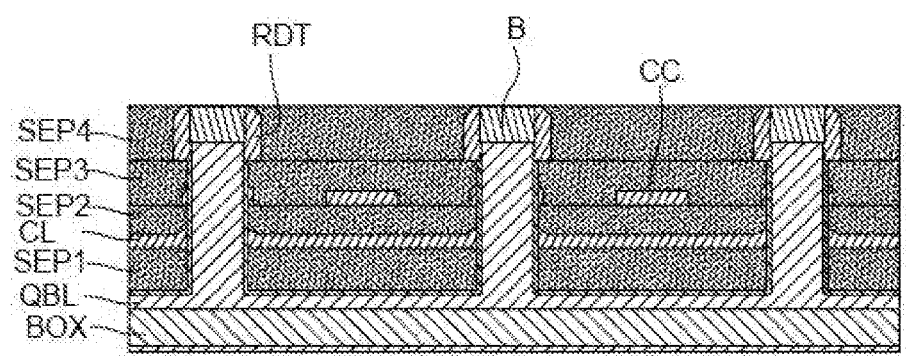

[Fig. 18b]
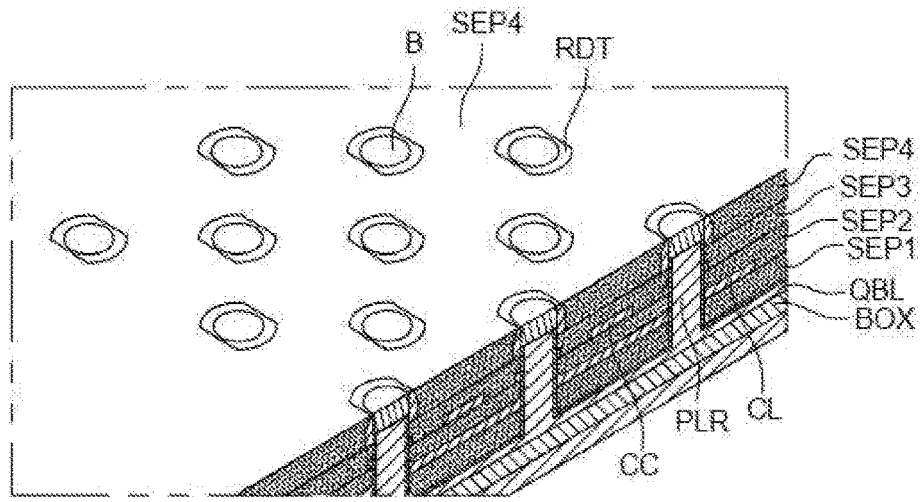
[Fig. 19a]
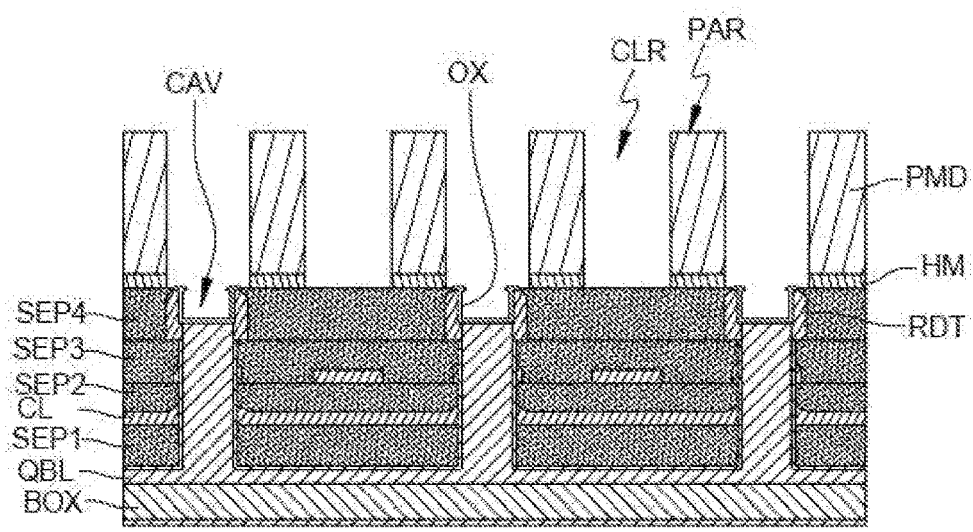
[Fig. 19b]
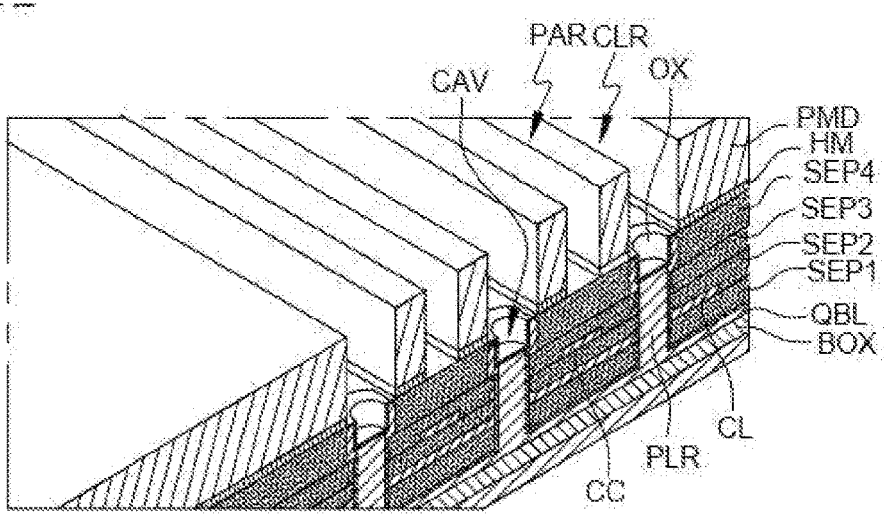

[Fig. 20a]
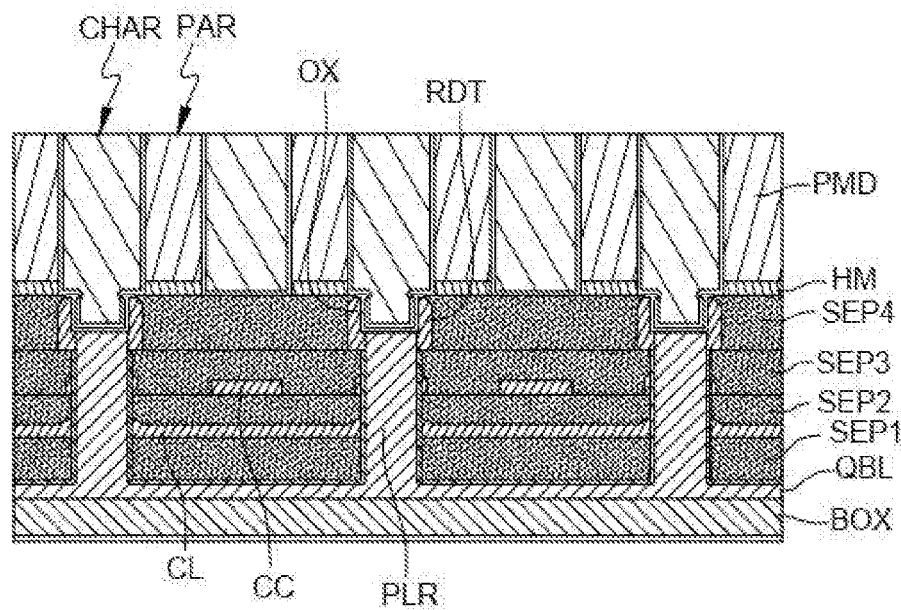
[Fig. 20b]
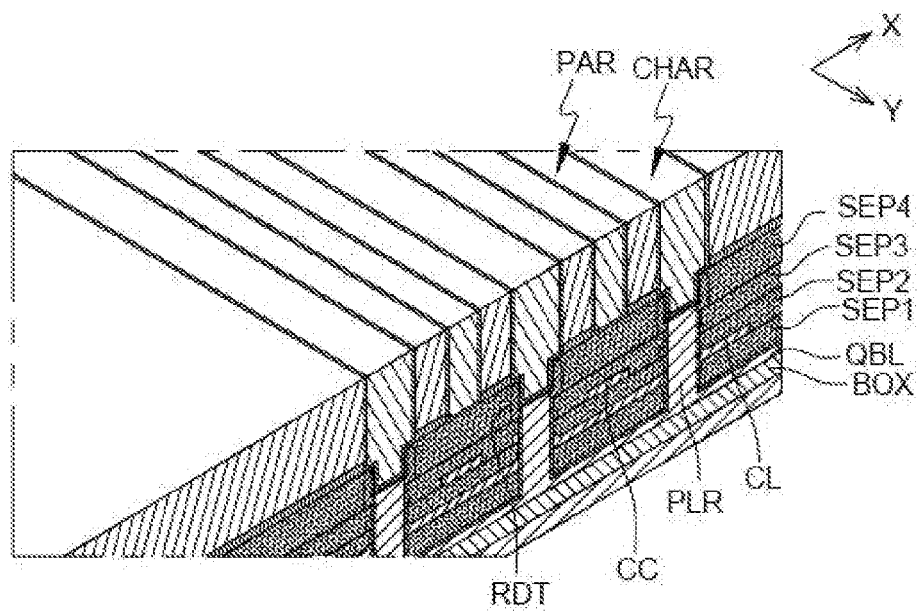

[Fig. 21]
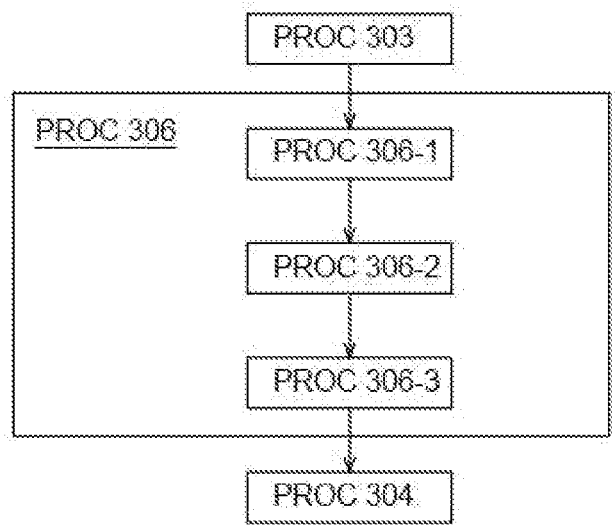
[Fig. 22]
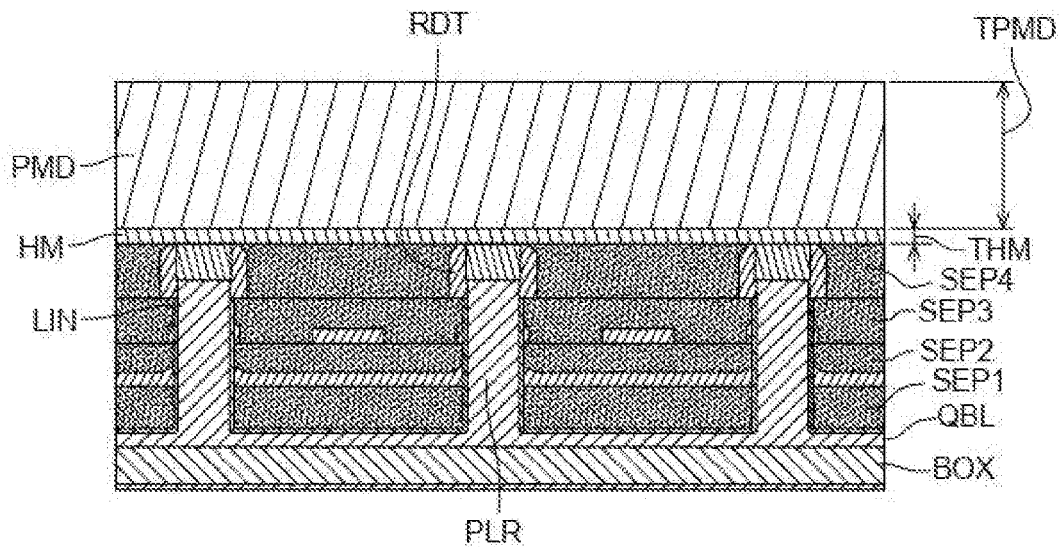

[Fig. 23a]
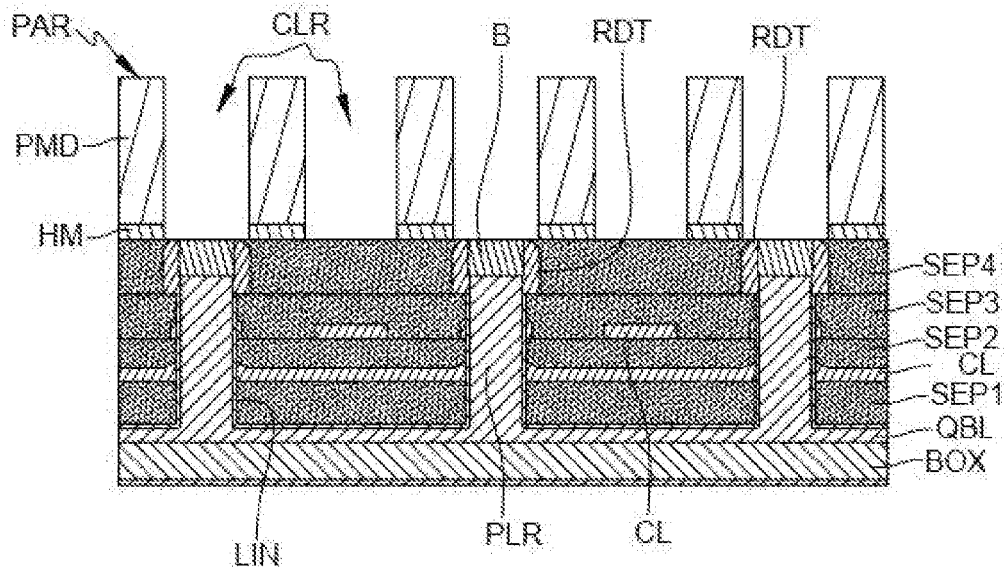
[Fig. 23b]
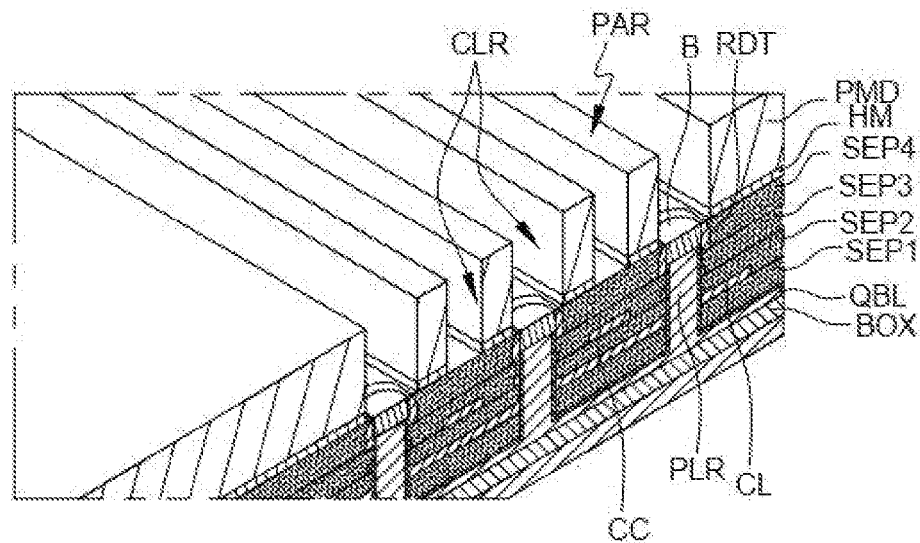

[Fig. 24]
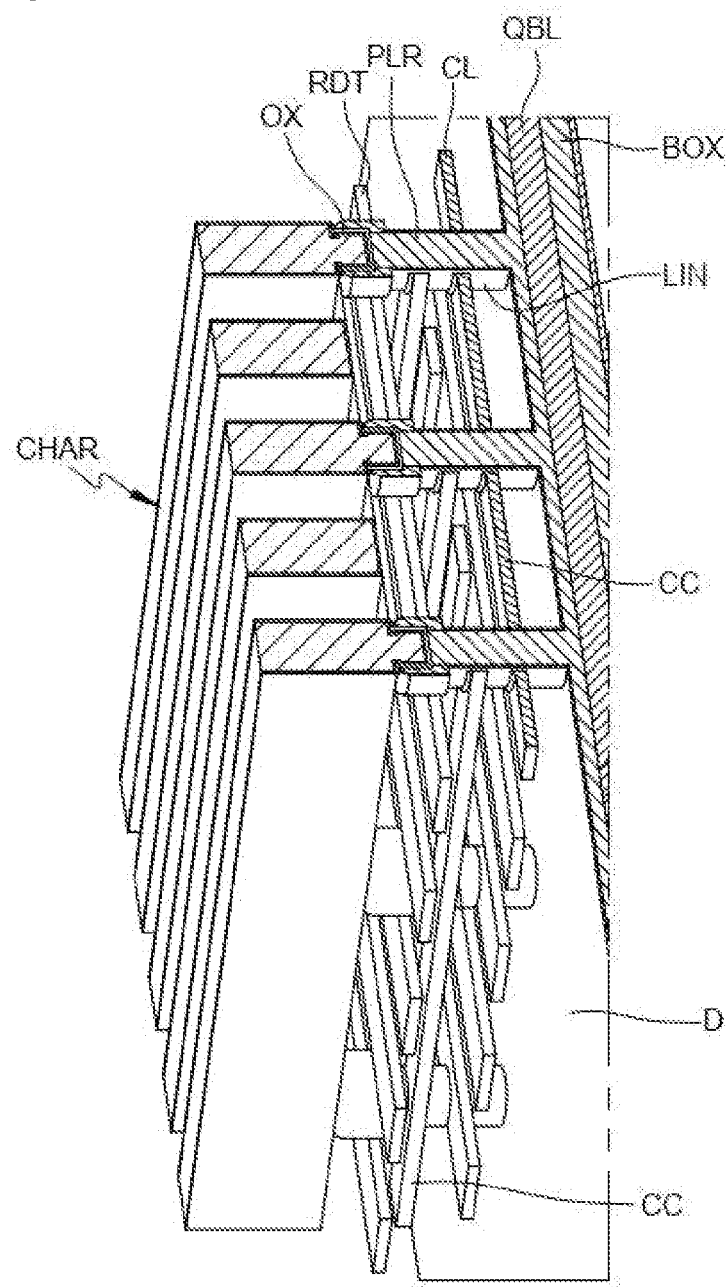

[Fig. 25]
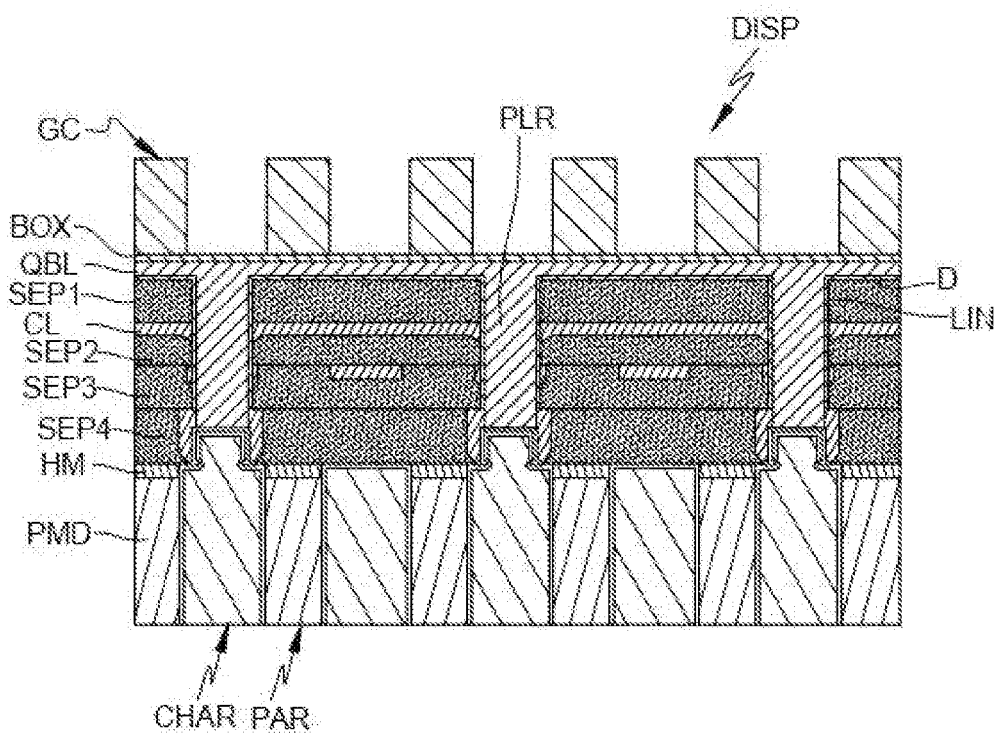

METHOD FOR MANUFACTURING A QUANTUM ELECTRONIC CIRCUIT

CROSS-REFERENCE TO RELATED APPLICATIONS

This application claims priority to French Patent Application No. 2110390, filed Oct. 1, 2021, the entire content of which is incorporated herein by reference in its entirety.

FIELD

The technical field of the invention relates to quantum electronics and more particularly to the manufacture of a quantum electronic circuit.

BACKGROUND

The manipulation of quantum states, also called "qubits" for "quantum bits", offers new possibilities in the manipulation of information. Quantum electronic circuits capable of manipulating qubits include islands, also known as quantum boxes. Quantum boxes are capable of storing qubits for the time of their manipulation and measurement.

The integration of quantum boxes in the form of quantum electronic circuits should meet several requirements. On the one hand, providing a high density of quantum boxes in order to provide a significant computational capacity. On the other hand, the methods for manufacturing said quantum electronic circuits should make it possible to achieve an industrial production rate while ensuring low variability of the circuits. Indeed, the storage and manipulation of qubits within quantum boxes are highly dependent on couplings between the different components forming the quantum electronic circuits.

Quantum electronic circuits should provide the possibility of coupling several qubits together to allow a computation to be performed from a set of qubits. In some cases, the coupling operation is performed by controlling tunnelling coupling between quantum boxes containing the qubits. However, controlling tunnelling coupling requires the quantum boxes to be interconnected in the form of dense matrices. In addition, the quantum boxes should also be able to be coupled to charge carrier reservoirs and charge detectors. In order to allow the densification of the quantum boxes, it is provided to integrate and connect the charge carrier reservoirs and the charge detectors in planes different from the plane comprising the quantum boxes. This is referred to as a non-planar architecture circuit, also called "3D" for "three-dimensional" architecture circuit.

Two types of 3D architecture circuits are emerging today. On the one hand, so-called qubit individual-controlled circuits also called "fully controlled" and on the other hand, so-called parallel-controlled circuits also called "crossbar network". Although individually controlled circuits facilitate the manipulation of qubits, they have a complex electrical architecture with a high density of vias and interconnections. Parallel-controlled circuits, on the other hand, provide a simpler architecture, especially due to the reduced density of vias and interconnections.

Patent application FR 3 066 297 provides a method for manufacturing a parallel-controlled quantum electronic circuit. The manufacturing method comprises firstly forming quantum boxes in a semiconducting layer. The method then comprises forming electrode arrays superimposed on each other and embedded in a thick layer of dielectric material.

The method disclosed also comprises forming pillars passing through said layer of dielectric material and electrode arrays until the quantum boxes are reached. The pillar formation step includes etching the dielectric layer and the embedded electrode arrays to form recessed cavities reaching the surface of the quantum boxes. Recontacting at the quantum boxes is achieved by epitaxy of a semiconductor material into the recessed cavities. The pillar formation step also comprises, prior to recontacting, forming an oxide layer on the sidewalls of the recessed cavities in order to insulate the pillars from the embedded electrode arrays. The semiconducting pillars thus formed, in contact with the quantum boxes, allow initialisation of the qubits and their measurement.

However, this method raises some problems. Firstly, forming the quantum boxes takes place on the front face of a silicon-on-insulator (SOI) substrate, while forming the electrode arrays and the recontacting of the pillars are performed on the back-face of the substrate. The method therefore requires a step of bonding and turning over the substrate and releasing the back face of the quantum boxes. The bonding/turning over steps can be difficult to perform and can result in defects at the bonding interface, such as electrostatic disorder. In addition, variations in the alignments of the pillars with respect to the quantum boxes may alter the coupling between said pillars and quantum boxes.

Secondly, forming the oxide layer in the recessed cavities is first performed at the side edges and the bottom of the cavity. The bottom of the cavity is then released by anisotropic etching to bare the surface of the quantum boxes and allow epitaxy of the pillars from the quantum boxes. Oxide deposition followed by anisotropic etching can render the interface between the quantum boxes and the pillar defective.

The method disclosed therefore does not reduce variability of the circuits produced.

SUMMARY

The invention provides a solution to the above problem, by making it possible to produce a quantum electronic circuit without an interface between the semiconducting pillars and a semiconducting layer for receiving the quantum boxes.

For this, an aspect of the invention relates to a method for manufacturing a quantum electronic circuit, the method being implemented from a substrate including on one of its surfaces a first monocrystalline semiconducting layer and comprising the following steps of:
  etching the first semiconducting layer so as to:
    obtain a plurality of semiconducting pillars, each semiconducting pillar having a first end, called a "base"; and
    retain a part of the first semiconducting layer, called a "qubit layer", at the base of each semiconducting pillar;
  oxidising the flank of each semiconducting pillar so as to form a plurality of first dielectric layers, called "flank dielectrics";
  depositing a second dielectric layer, called a "first separation layer", on the qubit layer;
  forming a plurality of first conductive electrodes substantially parallel to each other, called "coupling rows", on the first separation layer, each coupling row being in contact with the flank dielectric of at least one semiconducting pillar;

depositing a third dielectric layer, called a "second separation layer", on the plurality of coupling rows;

forming a plurality of second conductive electrodes substantially parallel to each other, called "coupling columns", on the second separation layer, each coupling column being in contact with the flank dielectric of at least one semiconducting pillar;

depositing a fourth dielectric layer, called a "third separation layer", on the plurality of columns such that a portion of each flank dielectric protrudes from the third separation layer; and etching each portion of the flank dielectrics protruding from the third separation layer in order to expose a surface of each semiconducting pillar, called a "contact surface".

The method thus makes it possible to manufacture a quantum electronic circuit comprising a qubit layer in which the quantum boxes for receiving the qubits can be formed. The method allows semiconducting pillars with crystalline continuity with the qubit layer to be formed. Thus, variability of the circuits produced is reduced.

In addition to the characteristics just discussed in the preceding paragraph, the method according to various aspects of the invention may have one or more additional characteristics among the following, considered individually or in any technically possible combination:

the thickness of the qubit layer is between 5 nm and 35 nm;

the coupling rows cross the coupling columns in an embodiment at a substantially right angle;

the first semiconducting layer is made of silicon and in an embodiment isotope-enriched silicon, for example silicon 28;

the first semiconducting layer comprises a front-face monocrystalline semiconducting layer and an epitaxially grown monocrystalline semiconducting layer, the epitaxially grown monocrystalline semiconducting layer being obtained by means of full plate epitaxy from the front-face monocrystalline semiconducting layer;

the oxidation step for forming the flank dielectric for each semiconducting pillar comprises the following sub-steps of: oxidising the free surface of each semiconducting pillar so as to form, at the flank of each semiconducting pillar, a sacrificial dielectric layer; removing the sacrificial dielectric layer; and oxidising the free surface of each semiconducting pillar so as to form, at the flank of each semiconducting pillar, the flank dielectric;

each flank dielectric is obtained by thermally oxidising the flank of each semiconducting pillar;

forming the plurality of coupling rows comprises: conformally depositing a first conductive layer totally covering the first separation layer and each semiconducting pillar; depositing a fifth dielectric layer so as to fully cover the first conductive layer; etching the fifth dielectric layer so as to bare a plurality of portions of the first conductive layer, called "caps", and retain a residual thickness of the fifth dielectric layer, each cap covering an upper portion of each semiconducting pillar; etching the first conductive layer and the fifth dielectric layer so as to remove each cap and the residual thickness of the fifth dielectric layer; and etching the first conductive layer so as to obtain the coupling rows;

the method comprises, prior to etching the first semiconducting layer, forming a plurality of protective pads on the first semiconducting layer, etching the first semiconducting layer comprising anisotropically etching a first part of the first semiconducting layer so as to obtain a semiconducting pillar under each sacrificial pad;

the method comprises, after etching each portion of the flank dielectrics, the following additional steps of: removing the protective pad from each semiconducting pillar so as to expose the second end of said semiconducting pillar; and depositing a doped conductive layer, called an "initialisation layer", covering at least the second end and the contact surface of each semiconducting pillar;

the initialisation layer is made of heavily doped polycrystalline silicon;

the method comprises, after depositing the initialisation layer, forming conductive contacts at each coupling row, each coupling column and the initialisation layer;

the method comprises, after etching each portion of the flank dielectrics, the following additional steps of: forming a plurality of third doped conductive electrodes, called "readout rows", each readout row being in contact with at least one semiconducting pillar; depositing a sixth dielectric layer, called a "fourth separation layer", covering the readout rows and covering the plurality of protective pads; planarising the fourth separation layer and the plurality of readout rows until the protective pads are reached; selectively etching the plurality of protective pads so as to leave a plurality of cavities vertically aligned with each semiconducting pillar; and forming a gate structure, called a "charging gate", in each cavity;

each readout row is in contact with the contact surface of at least one semiconducting pillar;

the method comprises, after forming each charging gate, forming conductive contacts at each coupling row, each coupling column, each readout row and each charging gate.

Another aspect of the invention relates to a quantum electronic circuit likely to be obtained by the manufacturing method according to the invention.

The invention and its various applications will be better understood upon reading the following description and examining the accompanying figures.

BRIEF DESCRIPTION OF THE FIGURES

The figures are set forth by way of indicating and in no way limiting purposes of the invention.

FIG. 1 schematically sets forth a flow chart of a manufacturing method according to a first implementation of the invention.

FIG. 2 schematically sets forth a substrate implemented by the method according to FIG. 1.

FIG. 3 to FIG. 10b schematically set forth the steps of the method according to FIG. 1.

FIG. 11a and FIG. 11b schematically set forth a first embodiment of a quantum electronic circuit likely to be obtained by implementing the method according to FIG. 1.

FIG. 12 schematically sets forth a flow chart of the manufacturing method according to a second implementation of the invention.

FIG. 13 and FIG. 14 schematically set forth the steps of the method according to FIG. 12.

FIG. 15 schematically sets forth a second embodiment of the quantum electronic circuit likely to be obtained by implementing the method according to FIG. 12.

FIG. 16 schematically sets forth a flow chart of the manufacturing method according to a third implementation of the invention.

FIG. 17a to FIG. 23b schematically set forth the steps of the method according to FIG. 16.

FIG. 24 schematically sets forth a third embodiment of the quantum electronic circuit likely to be obtained by implementing the method according to FIG. 16.

FIG. 25 schematically sets forth a development of the quantum electronic circuit according to FIG. 24.

Unless otherwise specified, a same element appearing in different figures has a unique reference.

The figures are set forth by way of indicating and in no way limiting purposes of the invention.

DETAILED DESCRIPTION

The invention aims to reduce variability of the electronic behaviour of a quantum electronic circuit obtained during its manufacture. The reduction of variability is especially achieved by improving the interface between a semiconducting layer, for receiving quantum bits also called "qubits", and semiconducting pillars, for initialising and measuring said qubits.

The FIG. 1 schematically sets forth a first implementation of a manufacturing method PROC according to an aspect of the invention, making it possible to obtain a quantum electronic circuit DISP according to a first embodiment. The method PROC comprises the following steps of:
  etching PROC102 a first part of said first semiconducting layer so as to obtain:
    a plurality of semiconducting pillars; and
    retain a second part of said first semiconducting layer, called a "qubit layer";
  oxidising PROC103 the flank of each semiconducting pillar so as to form a plurality of first dielectric layers, called "flank dielectrics";
  depositing PROC104 a second dielectric layer, called a "first separation layer", on the qubit layer;
  forming PROC105 a plurality of first conductive electrodes, called "coupling rows", on the first separation layer;
  depositing PROC106 a third dielectric layer, called a "second separation layer", on the plurality of coupling rows;
  forming PROC107 a plurality of second conductive electrodes, called "coupling columns", on the second separation layer;
  depositing PROC108 a fourth dielectric layer, called a "third separation layer", on the plurality of columns such that a portion of each flank dielectric protrudes from the third separation layer; and
  etching PROC109 each portion of the flank dielectric protruding from said third separation layer so as to obtain a surface of each semiconducting pillar exposed, called a "contact surface".

The method PROC thus makes it possible to manufacture a quantum electronic circuit comprising a qubit layer. The qubit layer can receive qubits during their storage and manipulation.

The method provided in prior art document FR 3 066 297 includes epitaxial recontacting at the quantum boxes. However, epitaxial growth may cause crystalline realignment and/or the appearance of defects at the interface between the start-up layer and the epitaxially grown layer. The method according to the invention makes it possible to obtain the qubit layer and the semiconducting pillars etched in the same first semiconducting layer, that is, in the same crystal. Said etching makes it possible to delimit the plurality of semiconducting pillars and the qubit layer while retaining a crystalline continuity between the layer and the pillars, thus avoiding the appearance of defects or an interface. Crystalline continuity can be checked by imaging techniques such as scanning electron microscopy or transmission electron microscopy. A device obtained by the invention would show an absence of interface between the qubit layer and the semiconducting pillars. A device obtained by a method of prior art would show defects or an interface between the qubit layer and the semiconducting pillars.

The method according to the invention also simplifies circuit manufacturing by reducing the number of transfers required to manufacture the coupling rows and columns and the qubit layer.

Etching PROC102 the plurality of semiconducting pillars PLR can be performed from a substrate SUB as illustrated in [FIG. 2], including on one of its surfaces the first semiconducting layer S1. The first semiconducting layer S1 is monocrystalline and beneficially comprises a defect density lower than $10^6$ cm$^{-3}$. The first semiconducting layer S1 has a thickness, measured perpendicular to the free surface, in an embodiment greater than or equal to 100 nm. The thickness of the first semiconducting layer S1 makes it possible to etch said layer S1 so as to form the qubit layer while ensuring that the pillars are high enough to protrude from the coupling rows and columns and the third separation layer. The thickness of the first semiconducting layer S1 can be reduced or increased depending on whether the circuit to be manufactured includes more or fewer coupling rows/columns. For example, third conductive electrodes, forming for example coupling diagonals, could be added, requiring larger semiconducting pillars so that they can protrude from the last separation layer.

As previously mentioned, the first semiconducting layer S1 is made of single-crystal silicon in order to be compatible with standard manufacturing methods in the field. The silicon of the first semiconducting layer S1, if applicable, can also be enriched with an isotope such as silicon 28. This increases intrinsic coherence time of the qubit layer. The concentration of silicon 28 in the first semiconducting layer S1 is for example greater than 99.9%.

The first semiconducting layer S1 can be obtained from a substrate, for example of SOI type, comprising a front-face monocrystalline semiconducting layer FRT, a back-face semiconducting layer BCK and an insulating layer BOX. The insulating layer is disposed between the two previous layers FRT, BCK, in other words, buried under the front-face semiconducting layer FRT. Epitaxy from the front-face monocrystalline semiconducting layer FRT makes it possible to obtain an epitaxially grown semiconducting layer EPI. The front-face monocrystalline semiconducting layer FRT and the epitaxially grown semiconducting layer EPI thus form the first semiconducting layer S1. An epitaxy for example carried out in full plate makes it possible to retain the crystalline quality of the front-face semiconducting layer FRT and thus obtain a first monocrystalline semiconducting layer S1. Moreover, performing an epitaxy makes it possible to control the thickness of the epitaxially grown semiconducting layer EPI and thus the thickness of the first semiconducting layer S1 without resorting to an etching step. The first semiconducting layer S1 then comprises the epitaxially grown semiconducting layer EPI and the front-face semiconducting layer FRT. It is desirable that the first semiconducting layer S1 has a good crystalline quality in order to manufacture a quantum electronic circuit with good electronic characteristics and low variability. For this reason, it is desirable that the first semiconducting layer is obtained partly by epitaxy.

The epitaxially grown semiconducting layer EPI can also be thinned if it is too thick. A method well known to the person skilled in the art, such as successive oxidation/etching steps, can be implemented.

FIG. 4a illustrates the etching PROC102 of the first semiconducting layer S1 so as to obtain the semiconducting pillars and the qubit layer. For this, a first part G of the first semiconducting layer S1 is etched in order to obtain the intermediate circuit illustrated in FIG. 4b. In order to obtain the plurality of semiconducting pillars PLR, said etching PROC102 is beneficially performed anisotropically, that is, along a preferential direction, for example perpendicular to the free surface of the first semiconducting layer S1. Protective pads B made of hard material may be disposed on the surface of the first semiconducting layer S1, to protect a part of said layer S1 and to enable a semiconducting pillar PLR to be formed under each protective pad B.

A particular arrangement of the qubits within the qubit layer in the circuit in operation enables an error correction method called "surface code" to be implemented. For this, the qubits are in an embodiment arranged in a square array with a given pitch. A first part of the qubits is to form data qubits and a second part of the qubits is to form measurement qubits. The data and measurement qubits are disposed alternately, thus forming an array of staggered data qubits and an array of staggered measurement qubits. The arrays of staggered qubits thus have twice the pitch of the square array. Only the measurement qubits are to be arranged vertically aligned with the semiconducting pillar PLR, thus it is beneficial to also dispose the latter in a staggered manner.

Etching PROC102 the first part G of the first semiconducting layer S1 is also performed so as to retain a second part QBL of the first semiconducting layer S1, called the qubit layer. By retain, it is meant that etching PROC102 is, for example, stopped before the entire thickness of the first semiconducting layer S1 is etched. Said etching PROC102 is performed such that the thickness TQBL of the qubit layer QBL is in an embodiment between 5 nm and 35 nm, in particular between 10 nm and 20 nm, for example equal to 15 nm.

The plurality of semiconducting pillars PLR, as illustrated in [FIG. 4b], thus rest on the qubit layer QBL. A first end PLRa of each semiconducting pillar PLR, which will be referred to as the "base", rests on the qubit layer QBL. A second end PLRb of each semiconducting pillar PLR, referred to as the "head", is for example disposed under a protective pad B. Etching PROC102 the first part G of the first semiconducting layer S1 thus makes it possible to obtain a crystalline continuity between the pillars PLR and the qubit layer QBL at each base PLRa of the pillars PLR. As the first semiconducting layer S1 is monocrystalline, the qubit layer QBL and the pillars PLR are thus made of the same crystal. Each pillar PLR may have a height HPLR, measured perpendicular to the qubit layer QBL, greater than 50 nm and in an embodiment greater than or equal to 80 nm.

Each semiconducting pillar PLR may have one or more flanks F depending on whether the pillar is cylindrical or parallelepipedal. For the sake of simplicity in the remainder of the description, reference will be made only to "the flank" of a semiconducting pillar to refer to the flank(s) of said pillar, depending on whether the latter is cylindrical or parallelepipedal. When etching PROC102 implements protective pads B, the flank F of each pillar PLR is thus disposed vertically aligned with the perimeter of each protective pad B. The diameter DPLR of each pillar PLR may coincide with the diameter of each protective pad B and is for example between 30 nm and 60 nm, for example equal to 50 nm. The diameter DPLR of each pillar PLR may also be smaller than the diameter of each protective pad B, especially when the etching implemented is not totally anisotropic. Thus, the flank of each pillar PLR is slightly set back from the vertical alignment of the perimeter of each pad B.

The method PROC beneficially includes, prior to etching PROC102 the first semiconducting layer S1, forming PROC101 the plurality of protective pads B on the first semiconducting layer S1. [FIG. 3] schematically sets forth the formation PROC101 of the plurality of protective pads B on the first semiconducting layer S1. The protective pads B are in an embodiment formed by deposition of the hard mask layer, followed by photolithography of a resin mask and anisotropic etching of the pads B through the resin mask. The protective pads B can also be formed by photolithography of a resin mask and deposition of a layer of so-called hard mask, for example SiN. In an embodiment, the protective pads B have a perimeter which may be circular or rectangular. Each protective pad B has a height HB, measured perpendicular to the surface of the first semiconducting layer S1, which may be between 20 nm and 80 nm. When the protective pads B are cylindrical, they each have a diameter DB which may be between 30 nm and 60 nm. When the protective pads B are parallelepipedal, they each have a diagonal that may be between 30 nm and 60 nm. For the sake of simplicity, the term "diameter" is used to refer to both the diameter of the cylindrical pads and the diagonal of the parallelepipedal pads.

In order to form the semiconducting pillars PLR in a staggered manner with respect to the qubit array, it is beneficial to dispose the protective pads B in a staggered manner on the first semiconducting layer S1.

When the method PROC is performed on an SOI type substrate, the qubit layer QBL then extends over the insulating layer BOX and more particularly between the plurality of semiconducting pillars PLR and the insulating layer BOX.

FIG. 5a illustrates a first implementation of the oxidation PROC103 of the flank F of each pillar PLR. Said oxidation PROC103 is performed so as to form, at each flank, a first dielectric layer LIN, called the "flank dielectric". Each pillar PLR is thus surrounded by a flank dielectric LIN. Said oxidation PROC103 is in an embodiment performed by thermal oxidation, as illustrated in FIG. 5b. In this way, a flank dielectric LIN fully embeds the flank of each semiconducting pillar PLR. The thickness TLIN of each flank dielectric LIN, measured perpendicular to the free surface of the flank dielectric LIN, is in an embodiment between 5 nm and 10 nm. The oxidation PROC103 can also form a dielectric layer D on the qubit layer QBL. The latter is of lesser interest as it will be covered by the first separation layer. On the other hand, thermal oxidation forms a better quality oxide than a deposited oxide. It is therefore beneficial not to remove said dielectric layer D on the qubit layer QBL before depositing the first separation layer.

Thermal oxidation has the effect of transforming a part of the semiconductor material of each pillar PLR into dielectric material. The interface IPL between the semiconductor material and the dielectric of each pillar PLR is not in vertical alignment APLB with the protective pad B but slightly set back, closer to the centre C of each pillar PLR. In [FIG. 5b], the interface IPL between a pillar PLR and a flank dielectric LIN is displaced by a distance E1 from the vertical alignment APLB of the protective pad B, towards the centre C of said pillar PLR. The interface IPL being set back with respect to the vertical alignment APLB makes it possible to protect the semiconductor material of the pillar PLR during the subsequent steps of the method PROC, especially the steps implementing anisotropic etching. Thus, the crystalline integrity of the pillar PLR and its crystalline properties are kept. In addition, part of the flank dielectric LIN is masked by the protective pad B and is thus protected from subsequent etching steps. Thermal oxidation forms a better quality oxide, so it is beneficial to retain such an oxide at the flank of each pillar.

On the other hand, the volume of oxidised material may increase during thermal oxidation, so that the free surface of each flank dielectric LIN may be distant from the vertical alignment APLB of the protective pad B and slightly exposed with respect to said pad B. In [FIG. 5b], the free surface of a flank dielectric LIN is distant from the vertical alignment APLB of the protective pad B by a distance E2. Thus, the following steps of the method PROC, implementing anisotropic etching, may also etch the exposed part of said flank dielectric LIN.

The coupling rows and columns, made secondly, form with each flank dielectric LIN a gate at each pillar PLR. It is therefore beneficial, to reduce the variability of manufactured circuits, to control the thickness TLIN of each flank dielectric LIN. It is easier to control the thickness of each flank dielectric LIN during their formation, that is, during the oxidation step PROC103, than during anisotropic etching.

FIG. 5c, FIG. 5d, FIG. 5e, and FIG. 5f illustrate an alternative implementation of the oxidation step PROC103 for improving the variability of the manufactured circuits. According to this alternative, the oxidation step PROC103 comprises a first sub-step PROC103-1 of oxidising the flank F of each pillar PLR so as to form, at the flank of each pillar PLR, a first sacrificial dielectric layer LIN0. Each first sacrificial dielectric layer LIN0 is then removed in a second sub-step PROC103-2, in an embodiment by isotropic etching, to release the free surface of each pillar PLR. Finally, a third sub-step PROC103-3 of oxidising the newly released surface of each pillar PLR thus forms a final flank dielectric LIN at the flank of each pillar PLR. Thanks to the etching 103-2 of the first sacrificial layer LIN0 and the reoxidation 103-3 of the flank of the pillars PLR, the free surface of each flank dielectric LIN is in vertical alignment APLB with the protective pad, or slightly set back. Thus, the subsequent steps of the method PROC, which may implement anisotropic etching, do not damage or thin the flank dielectrics LIN. In this way, the variability in the behaviour of the gates formed with the coupling rows and columns is reduced.

FIG. 6a illustrates the deposition PROC104 of the first separation layer SEP1, on the qubit layer QBL. When a dielectric layer D is formed in the oxidation step PROC103, and is not removed prior to forming the first separation layer SEP1, then said separation layer SEP1 is beneficially deposited on the dielectric layer D covering the qubit layer. The first separation layer SEP1 can be made from silicon oxide $SiO_2$. For this, the first separation layer SEP1 can be deposited, firstly, so as to totally cover the pillars PLR and the protective pads B, as illustrated in FIG. 6b. Planarising and anisotropically etching the first separation layer SEP1 enables the thickness of said layer SEP1 to be controlled. Planarising, for example by mechanical and/or chemical polishing, stops at the top of the protective pads B. Etching of the planarised first separation layer SEP1 is stopped before reaching the qubit layer QBL. The final thickness TSEP1 of the first separation layer SEP1, measured from the qubit layer QBL, is then for example between 20 nm and 40 nm. Thus, at least a first portion PLR1 of each pillar PLR protrudes from the first separation layer SEP1. Depositing PROC104 can be performed by chemical vapor deposition (CVD) and/or plasma assisted chemical deposition. Upon completion of said deposition step PROC104, the first separation layer SEP1 covers and surrounds the base PLRa of each pillar PLR.

FIG. 7a and FIG. 7b illustrate a structure resulting from the step of forming PROC105 the plurality of coupling rows CL. The coupling rows CL are to apply an electrostatic field to each first pillar portion PLR1 protruding from the first separation layer SEP1, making it possible to allow or block the passage of electrons in the pillar PLR to or from the qubit. For this, they beneficially form, together with the flank dielectrics LIN, a gate at each first portion PLR1 of the pillar PLR. In order to improve the coupling of each coupling row CL with a pillar PLR, it is desirable that each coupling row CL surrounds a first annular portion LINA1 of the flank dielectric LIN, for example at the first portion PRL1 of the pillar PLR. For this, each coupling row CL is in contact with the flank dielectric LIN surrounding at least one pillar PLR. In an embodiment each coupling row CL is formed PROC105 so as to surround a first annular portion LINA1 of at least one flank dielectric LIN protruding from the first separation layer SEP1. Each coupling row CL is in contact with at least one flank dielectric LIN. Each coupling row CL may also be in contact with a plurality of flank dielectrics LIN. In this way, a coupling row CL can apply an electrostatic field to a plurality of pillars PLR. In combination with the coupling columns (described below), it allows the indexing of each pillar PLR and thus each qubit independently. As the pillars PLR are disposed in a staggered manner, each coupling row CL can contact a plurality of flank dielectrics LIN by extending along a first direction X coincident with a row of pillars PLR. FIG. 7b illustrates a 3D view of the pillars PLR and the coupling rows CL obtained after their formation PROC105. The pillars are arranged in a staggered manner forming rows along the first direction X and columns along a second direction Y.

An alternative embodiment of the formation step PROC105 is detailed by [FIG. 7c] and illustrated by [FIG. 7d] to [FIG. 7h]. The formation step PROC105 may include a first conformal deposition PROC105-1 of a first conductive layer M1, for example of doped polycrystalline silicon or titanium nitride. The first deposition PROC105-1 is in an embodiment conformal and allows the first separation layer SEP1, the flank dielectrics LIN and the protective pads B to be totally covered. The first conductive layer M1 may have a thickness TM1 between 10 nm and 15 nm. The formation step PROC105 may comprise depositing PROC105-2 a fifth dielectric layer D3, illustrated by [FIG. 7d], for example of silicon oxide, so as to fully cover the assembly.

The formation step PROC105 may also comprise etching PROC105-3 the fifth dielectric layer D3, as illustrated in [FIG. 7e] and [FIG. 7f], performed anisotropically and selectively with respect to the first conductive layer M1. The first etching PROC105-3 bares a plurality of portions CAP of the first conductive layer M1, called "caps". Each cap CAP covers a protective pad B and an upper portion of a pillar PLR. Etching PROC105-3 the fifth dielectric layer D3 is stopped so as to leave a residual thickness TD3 of 10 nm to 15 nm, at the base of each cap CAP.

The formation step PROC105 may also comprise etching PROC105-4 the first conductive layer M1 and the fifth dielectric layer D3, as illustrated in [FIG. 7g] and [FIG. 7h], so as to remove the plurality of caps CAP and the residual thickness TD3 of the fifth dielectric layer D3. The remaining first conductive layer M1 then extends over the first separation layer SEP1 and surrounds a first annular portion LINA1 of each flank dielectric LIN.

Etching PROC105-4 the first conductive layer M1 may be performed in a single operation, for example by non-selective and isotropic etching, allowing the plurality of caps CAP and the residual thickness TD3 of the fifth dielectric layer D3 to be removed at the same time. The residual thickness TD3 of the fifth dielectric layer D3 is then beneficially chosen so that it is fully removed when the caps CAP are removed.

Etching PROC105-4 may also be performed in two sub-steps. A first sub-step comprising selectively etching the first conductive layer M1 with respect to the residual thickness TD3 of the fifth dielectric layer D3 so as to remove the caps CAP. A second sub-step comprising anisotropically etching the residual thickness TD3 of the fifth dielectric layer D3 so as to remove the fifth dielectric layer D3. Since it is not performed selectively, the second sub-step is stopped before substantially etching the first conductive layer M1.

In order to finalise the coupling rows CL, as illustrated in [FIG. 7b], the formation step PROC105 may include etching PROC105-6 the first conductive layer M1 through this resin mask so as to obtain the coupling rows CL. The formation step PROC105 may comprise, for example, prior to said etching PROC105-6, photolithography PROC105-5 of a resin mask on the first conductive layer M1, followed by etching PROC105-6 of the first conductive layer M1 through the resin mask so as to obtain the coupling rows CL. The coupling rows are in an embodiment substantially parallel to each other and in an embodiment extend along the first direction X. By substantially parallel, it is meant to within ±30°, for example within ±20° or even within ±10°.

According to an alternative of the etching PROC105-4 of the first conductive layer M1, only the caps CAP are removed, for example by selective etching. The residual thickness TD3 of the fifth dielectric layer D3 is then used to form a mask in the aforementioned photolithography sub-step PROC105-5 and thus allow etching PROC105-6 of the coupling rows CL through said mask. The fifth dielectric layer D3 is removed, for example by selective etching, after the coupling rows CL are obtained.

FIG. 8 schematically sets forth the step of depositing PROC106 the second separation layer SEP2. The second separation layer SEP2 is deposited so as to cover the plurality of coupling rows CL, thus ensuring their electrical insulation. The second separation layer SEP2 may also be deposited so as to cover the first separation layer SEP1. Depositing PROC106 the second separation layer SEP2 is benenficially performed in the same manner as depositing the first separation layer SEP1, as illustrated in [FIG. 6a] and [FIG. 6b]. The second separation layer SEP2 may, for example, be made from silicon oxide $SiO_2$. The thickness TSEP2 of the second separation layer SEP2 is in an embodiment between 20 nm and 40 nm. Said thickness TSEP2 is measured from the first separation layer SEP1 on which the coupling rows CL rest.

The thickness TSEP2 of the second separation layer SEP2 is in an embodiment chosen such that at least a second portion PLR2 of each pillar PLR protrudes from the second separation layer SEP2.

FIG. 9a and FIG. 9b illustrate the step of forming PROC107 the plurality of coupling columns CC. In the same way as the coupling rows CL, the coupling columns CC benficially form, together with the flank dielectrics LIN, a gate at each pillar PLR. The coupling rows and columns CL, CC are thus to apply an electrostatic field to the first and second portions PLR1, PLR2 of a same pillar PLR, making it possible to allow or block the passage of electrons in said pillar PLR. The coupling rows and columns CL, CC are arranged so that applying an electrical potential to one of the rows CL and one of the columns CC makes it possible to allow or block the passage of electrons from only one pillar PLR among the plurality of pillars PLR. The coupling rows and columns CL, CC thus allow individual indexing of the qubits to, for example, initialise or measure their state.

It is thus also beneficial that the coupling of each coupling column CC with the pillars PLR is reproducible and maximal. It is thus desirable that the coupling columns CC surround, in the same way as the coupling rows CL, a second annular portion LINA2 of a flank dielectric LIN and thus the second portion PLR2 of a pillar PLR. For this, each coupling column CC is in contact with at least one flank dielectric LIN. In an embodiment, each coupling column CC is formed PROC107 so as to surround a second annular portion LINA2 of at least one flank dielectric LIN, protruding from the second separation layer SEP2.

The coupling columns CC beneficially extend over the second separation layer SEP2. The latter, covering the coupling rows CL, ensures electrical insulation between the coupling rows and columns CL, CC. However, capacitive coupling may still exist between the coupling rows and columns CL, CC. In order to reduce the capacitive coupling, it is beneficial that the coupling columns CC are made so that they cross the coupling rows CL at a substantially right angle. By substantially right angle, it is meant right to within ±30°, for example within ±20°, or even within ±10°.

Thus, the coupling columns CC extend in an embodiment parallel to each other and along the second direction Y. Thus, they can contact the flank dielectrics LIN of a plurality of pillars PLR aligned along the second direction Y and reduce capacitive coupling with the coupling rows CL.

FIG. [9b] illustrates a 3D view of the pillars PLR, coupling rows CL, and coupling columns CC obtained at the end of the step of forming PROC107 the columns CC.

As the pillars are arranged in a staggered manner and forming rows and columns along the first direction X and the second direction Y, respectively, the coupling columns CC are in an embodiment oriented perpendicular to the coupling rows CL. However, it is possible that the coupling columns CC form another angle with the coupling rows CL, for example 45°. In this case, the second conductive DC electrodes are called "coupling diagonals".

The step of forming PROC107 the coupling columns CC is in an embodiment similar to the step of forming PROC105 the coupling rows CL as illustrated in FIG. 7a to FIG. 7h.

FIG. 10a and FIG. 10b illustrate the step of depositing PROC108 the third separation layer SEP3. Said third separation layer SEP3 rests on the plurality of coupling columns CC and embeds said plurality of columns CC. Depositing PROC108 the third separation layer SEP3 may be performed in the same manner as depositing PROC105 the first separation layer SEP1, as illustrated in FIG. 6a and FIG. 6b and/or depositing PROC107 the second separation layer SEP2. The third separation layer SEP3 may also be made from silicon oxide $SiO_2$. The third separation layer SEP3 embeds the coupling columns CC and may also cover the second separation layer SEP2. Also, the third separation layer SEP3 has a thickness TSEP3 measured from the second separation layer SEP2 on which the coupling columns CC rest.

Unlike the first and second separation layers SEP1, SEP2, the thickness TSEP3 of the third separation layer SEP3 is configured such that a third portion PLR3 of each pillar PLR protrudes from said third separation layer SEP3. In this way, a third annular portion LINA3 of each flank dielectric LIN, surrounding the third portion PLR3 of each pillar PLR, also protrudes from said third separation layer SEP3. The third annular portion LINA3 then extends over the entire height HLPR3 of the third portion PLR3 of the pillar PLR, that is, from the free surface FSEP3 of the third layer SEP3 to the top of each pillar PLR, thus being flush with the protective pads B placed on each pillar PLR. The thickness TSEP3 of the third separation layer SEP3 and/or the height HPLR of each pillar PLR is chosen such that the height HPLR3 of the third portion PLR3 is between 5 nm and 20 nm inclusive, for example 10 nm. The thickness TSEP3 of the third separation layer SEP3 may be between 20 nm and 40 nm.

In order to adjust the thickness TSEP3 of the third separation layer SEP3, it may be, firstly, deposited so as to protrude from the top of the protective pads B. Secondly, it can be planarised until it is flush with the top of the protective pads B. Finally, the third separation layer SEP3 can be anisotropically etched in order to bare the protective pads B and the third annular portion LINA3 of each flank dielectric LIN.

FIG. 11a and FIG. 11b illustrate the etching PROC109 of the third annular portions LINA3 of each flank dielectric LIN so as to bare the third portion PLR3 of each pillar PLR. The third pillar portion PLR3 thus exposes a contact surface CS, called a "contact surface". The contact surface CS may be used to electrically connect the pillar PLR to a conductive electrode so as to allow the passage of electrons to or from the qubit layer QBL. The contact surface CS may also be connected to a qubit quantum state readout device for reading the state of the qubit located vertically aligned with said pillar PLR.

Etching PROC109 the third annular portions LINA3 of each flank dielectric LIN is in an embodiment performed so as to fully remove them. For this, said etching PROC109 may be performed selectively, at least with respect to the protective pads B. When the flank dielectrics LIN are composed of $SiO_2$, etching PROC109 may be performed using dilute hydrofluoric acid HF.

The method PROC thus makes it possible to manufacture a quantum electronic circuit DISP comprising a qubit layer QBL and a plurality of pillars PLR made from a single crystal only and capable of being integrated into a quantum electronic system.

In other words, the quantum electronic circuit DISP obtained using the method PROC according to the invention then comprises:
 a qubit layer QBL;
 a plurality of semiconducting pillars PLR, the base of each semiconducting pillar PLR being in contact with the qubit layer QBL;
 a plurality of flank dielectrics LIN, each flank dielectric LIN surrounding the flank of each semiconducting pillar PLR while leaving a surface of the flank of each semiconducting pillar PLR exposed at the head of said semiconducting pillar PLR;
 a first separation layer SEP1 extending over the qubit layer QBL;
 a plurality of coupling rows CL extending over the first separation layer SEP1, each coupling row CL being in contact with the flank dielectric LIN of at least one semiconducting pillar PLR;
 a second separation layer SEP2 extending over the first separation layer SEP1 and embedding the plurality of coupling rows CL;
 a plurality of coupling columns CC extending over the second separation layer SEP3, each coupling column CC being in contact with the flank dielectric LIN of at least one semiconducting pillar PLR;
 a third separation layer SEP3 extending over the second separation layer SEP2 and embedding the plurality of coupling columns CC and leaving the head of a surface of each semiconducting pillar PLR exposed.

Said circuit DISP is remarkable in that the qubit layer QBL and each semiconducting pillar PLR belong to the same monocrystalline semiconductor material and thus have crystalline continuity.

FIG. 12 schematically sets forth a second implementation of the manufacturing method PROC, making it possible to obtain an electronic quantum circuit DISP according to a second embodiment. Unlike the first implementation PROC101-PROC109, the method PROC according to the second implementation comprises the following additional steps of:
 removing PROC201 each protective pad B; and
 depositing PROC202 a second doped conductive layer INI, called an "initialisation layer".

FIG. 13 illustrates the removal PROC201 of each protective pad B, so as to release the head PLRb of each pillar PLR. The removal of the sacrificial pads B may be performed by selective etching with respect to each pillar PLR and/or the third separation layer. When the protective pads B are made of silicon nitride, etching can for example be performed using phosphoric acid $H_3PO_4$.

FIG. 14 illustrates the deposition PROC202 of the initialisation layer INI so that it is in contact with each pillar PLR. For example, it covers at least the heads PLRb and contact surfaces CS of each pillar PLR. In this way the initialisation layer INI is in electrical contact with each pillar PLR and allows it to function as an electron reservoir in order to initialise each qubit vertically aligned with the connected pillars PLR. The initialisation layer INI is, for example, made of heavily doped polycrystalline silicon. Its thickness TINI is in an embodiment between 20 nm and 40 nm.

In order to improve the interface at the contact between each pillar PLR and the INI initialisation layer, depositing PROC202 the INI initialisation layer may comprise epitaxially depositing phosphorus-doped silicon Si:P or boron-doped silicon germanium SiGe:B. The epitaxy is in an embodiment performed selectively so as to be initiated from the exposed end of each pillar PLR, that is, their head PLRb and contact surface CS.

Depositing PROC202 the initialisation layer INI may also comprise a step of siliciding said initialisation layer INI, after the actual deposition of said layer INI. Siliciding is for example performed by means of platinum nitride NiPt. [FIG. 15] schematically sets forth the quantum electronic device DISP likely to be obtained at the end of the manufacturing method according to the second implementation. The first, second and third separation layers SPE1, SEP2, SEP3 are masked in order to have, with respect to each pillar PLR and the qubit layer QBL, the superposition of the coupling rows CL, the coupling columns CC and the initialisation layer INI.

The embodiment of the circuit DISP of [FIG. 15] thus differs from the embodiment of [FIG. 11a] and [FIG. 11b] in that the circuit DISP also includes an initialisation layer INI in contact with each semiconducting pillar PLR. [FIG. 16]

schematically sets forth a third implementation of the method for manufacturing PROC, making it possible to obtain the electronic quantum circuit DISP according to a third embodiment. Unlike the first implementation PROC101-PROC109 and the second implementation PROC 101-PROC202, the method PROC according to the third embodiment makes it possible to obtain a quantum electronic circuit DISP comprising a readout layer as well as a single-electron transistor at the top of each pillar PLR.

According to the third implementation, the method PROC comprises the following additional steps of:
- forming PROC301 a plurality of third doped conductive electrodes RTD, called "readout rows";
- depositing PROC302 a sixth dielectric layer SEP4, called a "fourth separation layer", covering the readout rows RDT;
- planarising PROC303 the sixth separation layer SEP4 and the plurality of readout rows RDT until the protective pads B are reached;
- selectively etching PROC304 the plurality of protective pads B so as to create a plurality of cavities; and
- forming PROC305 a gate structure, called a "charging gate," in each cavity.

FIG. 17a and FIG. 17b illustrate the formation PROC301 of the readout rows RDT. Each readout row RDT formed is in an embodiment at least in contact with a pillar PLR. In order to achieve good electrical contact between the readout rows and the pillars PLR, it is beneficial that each readout row RDT is in contact with the contact surface CS of a pillar PLR. In the example in [FIG. 17b], the readout rows RDT extend along the first direction X and connect the contact surface CS of a plurality of pillars PLR. Each readout row RDT may also be in contact with the flank K of a protective pad B. In the example of [FIG. 17a] and [FIG. 17b], the readout rows RDT extend over the third separation layer SEP3 and cover each protective pad B.

In order to reduce capacitive coupling between the coupling columns CC and the readout rows RDT, the latter are beneficially oriented perpendicular to the coupling columns CC.

Forming PROC301 the readout rows RDT may firstly comprise depositing a second conductive layer M2 on the contact surface CS of each pillar PLR, on each protective pad B and on the third separation layer SEP3, as illustrated in [FIG. 17c] and [FIG. 17d]. The second conductive layer M2 has a thickness TM2 which may be between 10 nm and 15 nm. The second conductive layer M2 may be made from doped polycrystalline silicon. Its deposition can be preceded by an epitaxy of phosphorus-doped silicon Si:P or boron-doped silicon germanium SiGe:B. In this way, the interface between the contact surface CS of each pillar and the second conductive layer M2 is improved.

Forming PROC301 the readout rows RDT may also include structuring the second conductive layer M2 so as to obtain each readout row RDT as illustrated in [FIG. 17a] and [FIG. 17b]. Structuring the second conductive layer M2 may be performed by photolithography of a resin mask through which the second conductive layer M2 is etched. Structuring is in an embodiment performed so as to form readout rows RDT substantially parallel to each other. By substantially parallel, it is meant parallel to within ±30°, for example within ±20° or even within ±10°. It is also performed so as to dispose two readout rows RDT on either side of a pillar PLR, each of the rows being at least in contact with the contact surface CS of said pillar PLR. The readout rows RDT illustrated in FIG. 17a and FIG. 17b also comprise a plurality of transverse portions RDTT completely covering the protective pads B and the contact surfaces CS of the pillars PLR. The transverse portions RDTT appear when the photolithographed resin mask includes portions above each pillar PLR, protecting the latter during etching and avoiding removal of the second conductive layer M2 from the flanks K of the protective pads B and the contact surfaces CS.

Structuring the second conductive layer M2 can also be performed in a self-aligned manner, without the need for transverse portions RDTT. Etching the second conductive layer M2 is, for example, performed anisotropically through a photolithographed resin mask comprising no portions above each pillar PLR. The topology of each pillar PLR has the effect of forming spacers of second conductive layer M2 around each pillar PLR.

FIG. 18a and FIG. 18b illustrate the steps of depositing PROC302 the fourth separation layer SEP4 and planarising PROC303 the fourth separation layer SEP4. Depositing PROC302 the fourth separation layer SEP4 is performed so as to cover the entire structure, especially the readout rows RDT and in an embodiment the third separation layer SEP3 and the protective pads B when these are not covered by readout rows RDT. The fourth separation layer SEP4 can be made from silicon oxide. The fourth separation layer SEP4 is then planarised PROC303 until the top of the protective pads B is released. In this step PROC303, a part of each readout row RDT may be removed, especially where these overlap the protective pads B. By doing so, each protective pad B comes out from the surface of the fourth separation layer SEP4.

FIG. 19a and FIG. 19b illustrate the selective etching PROC304 of the protective pads B with respect to the fourth separation layer SEP4 and with respect to the readout rows RDT. Etching PROC304 can be performed isotropically. It is in an embodiment stopped at the top of each pillar PLR, leaving the semiconductor material of each pillar PLR visible. Etching PROC304 the protective pads B thus allows the formation of a plurality of cavities CAV vertically aligned with each pillar PLR. Each cavity CAV is in an embodiment surrounded by a readout row RDT.

Each cavity CAV is to accommodate a charging gate CHAR for forming, together with a pillar PLR and a readout row RDT, a single-electron transistor. FIG. 19a and FIG. 19b illustrate a first step of forming PROC305 the charging gate CHAR, in each cavity CAV. Firstly, the walls of each cavity CAV, and in an embodiment the visible parts of the readout rows RDT, are oxidised so as to form a seventh dielectric layer OX, called a "gate oxide". The gate oxide OX is in an embodiment formed by thermal oxidation and beneficially has a thickness between 2 nm and 5 nm.

Forming PROC305 the charging gate CHAR also includes filling each cavity CAV, as illustrated in FIG. 20a and FIG. 20b, with a conductive material such as a metal or a set of metal layers. Filling each cavity CAV comprises, for example, conformally depositing a first metal layer, for example of titanium Ti, so as to cover the gate oxide OX at the bottom of each cavity CAV. Filling the cavities CAV may also comprise conformally depositing a silicide layer, for example of titanium nitride TiN, so as to cover the first metal layer. Finally, filling may comprise depositing a second metal layer, for example of tungsten W, covering the silicide layer and completely filling each cavity CAV.

The charging gates CHAR may be structured so as to connect a plurality of single-electron transistors. Benficially, they are substantially parallel to each other and oriented along one of the first or second directions X, Y. In this way, the charging gates CHAR can control a plurality of pillars PLR. However, in order to reduce capacitive coupling between the readout rows RDT and the charging gates CHAR, the latter are benficially oriented perpendicular to the readout rows RDT.

Thus, after the step of planarising PROC303 the fourth separation layer SEP4 and before the step of etching PROC304 the protective pads B so as to form the cavities CAV, the method PROC may comprise a step of forming PROC306 corridors CLR, each corridor CLR being desirably aligned with a plurality of pillars PLR. Charging gates CHAR are then desirably formed in each corridor CLR. The charging gates CHAR are thus insulated two by two. The corridors CLR are separated two by two by a wall PAR.

The step of forming PROC306 the corridors CLR, schematically shown in [FIG. 21]. It comprises a first sub-step PROC306-1, illustrated by [FIG. 22], comprising depositing a hard mask HM covering the fourth separation layer SEP4, the readout rows RDT and the protective pads B. The hard mask layer can be made from silicon nitride SiN or titanium nitride TiN. In an embodiment, it has a thickness THM of between 10 nm and 30 nm.

The step of forming PROC306 the corridors CLR comprises a second sub-step PROC306-2, also illustrated in [FIG. 22], comprising depositing an encapsulation layer PMD covering the hard mask HM. The encapsulation layer PMD is in an embodiment made from silicon oxide $SiO_2$ and may have a thickness TPMD greater than 80 nm.

The encapsulation layer PMD and hard mask HM layer are then etched in a third sub-step PROC306-3, illustrated in [FIG. 23a] and [FIG. 23b], so as to form trenches in the aforementioned materials, forming the corridors CLR. Etching PROC306-3 is in an embodiment performed through a resin mask obtained by a photolithography step. Etching the encapsulation layer PMD and hard mask HM layer stops at the top of the protective pads B. The walls PAR separating the corridors then beneficially comprise a portion of hard mask HM and a portion of encapsulation layer PMD.

The step of etching PROC304 the protective pads B, illustrated by [FIG. 19a] and [FIG. 19b], is beneficially performed when the walls PAR separating the corridors are already in place. In this way, the step of forming PROC306 the charging gates CHAR, illustrated by [FIG. 20a] and [FIG. 20b], makes it possible to obtain structured gates CHAR insulated from each other.

Forming PROC306 the charging gates CHAR may then include conformally depositing the metal layer in each cavity CAV and in each corridor CLR. The same applies to the conformal deposition of the silicide layer. Filling each cavity CAV may also enable each corridor CLR to be filled. At the end of the step of forming PROC306 the charging gates CHAR, planarising may be performed so as to ensure that there is no short circuit between the charging gates.

FIG. 24 schematically sets forth the quantum electronic circuit DISP likely to be obtained as a result of the manufacturing method according to the third embodiment. The first, second, third and fourth separation layers SPE1, SEP2, SEP3, SEP4 are masked in order to have, with respect to each pillar PLR and the qubit layer QBL, the superposition of the coupling rows CL, the coupling columns CC, the readout rows RDT and the charging gates CHAR.

The embodiment of the circuit DISP of FIG. 24 thus differs from the embodiment of FIG. 11a and FIG. 11b in that the circuit DISP includes:
a plurality of readout rows RDT extending over the third separation layer SEP3, each readout row RDT being in contact with at least one semiconductor PLR; and
a plurality of charging gates CHAR, each charging gate forming, together with a readout row RDT and a semiconducting pillar PLR, a single-electron transistor.

FIG. 25 schematically sets forth the circuit DISP obtained in a development of the method PROC. A plurality of control gates GC can be added to the previously obtained circuit in order to control and manipulate the state of each qubit. For this, the circuit DISP is turned over. When the circuit DISP is made from an SOI type substrate, that is, comprising an insulating layer BOX buried under the qubit layer QBL, then it is etched until the insulating layer BOX is reached. Then, a plurality of control gates GC, made of a conductive material, are formed on the insulating layer BOX. The control gates GC are in an embodiment substantially parallel to each other and are disposed between each pillar PLR.

Alternatively, the insulating layer BOX may be thinned. Alternatively, the insulating layer BOX may be fully removed and so as to deposit a new oxide layer, for example thinner than the insulating layer BOX, on the qubit layer QBL. The plurality of control gates GC is then formed on the new oxide layer.

The invention claimed is:

1. A method for manufacturing a quantum electronic circuit, the method being implemented from a substrate including on one of its surfaces a first monocrystalline semiconducting layer and comprising:
etching the first monocrystalline semiconducting layer so as to:
obtain a plurality of semiconducting pillars, each semiconducting pillar having a first end, forming a base; and
retain a part of the first monocrystalline semiconducting layer forming a qubit layer, at the base of each semiconducting pillar;
oxidising the flank of each semiconducting pillar so as to form a plurality of first dielectric layers forming flank dielectrics;
depositing a second dielectric layer forming a first separation layer, on the qubit layer;
forming a plurality of first conductive electrodes substantially parallel to each other forming coupling rows, on the first separation layer, each coupling row being in contact with the flank dielectric of at least one semiconducting pillar;
depositing a third dielectric layer forming a second separation layer, on the plurality of coupling rows;
forming a plurality of second conductive electrodes substantially parallel to each other forming coupling columns, on the second separation layer, each coupling column being in contact with the flank dielectric of at least one semiconducting pillar;
depositing a fourth dielectric layer forming a third separation layer, on the plurality of columns such that a portion of each flank dielectric protrudes from the third separation layer; and
etching each portion of the flank dielectrics protruding from the third separation layer in order to expose a surface of each semiconducting pillar forming a contact surface.

2. The method according to claim 1, wherein a thickness of the qubit layer is between 5 nm and 35 nm.

3. The method according to claim 1, wherein the coupling rows cross the coupling columns.

4. The method according to claim 1, wherein the first monocrystalline semiconducting layer is made of isotope-enriched silicon.

5. The method according to claim 1, wherein the first monocrystalline semiconducting layer comprises a front-face monocrystalline semiconducting layer and an epitaxially grown monocrystalline semiconducting layer, the latter being obtained by means of full plate epitaxy from the front-face monocrystalline semiconducting layer.

6. The method according to claim 1, wherein the oxidising for forming the flank dielectric for each semiconducting pillar comprises:
   oxidising a free surface of each semiconducting pillar so as to form, at the flank of each semiconducting pillar, a sacrificial dielectric layer;
   removing the sacrificial dielectric layer; and
   oxidising the free surface of each semiconducting pillar so as to form, at the flank of each semiconducting pillar, the flank dielectric.

7. The method according to claim 1, wherein each flank dielectric is obtained by thermally oxidising the flank of each semiconducting pillar.

8. The method according to claim 1, wherein forming the plurality of coupling rows comprises:
   conformally depositing a first conductive layer totally covering the first separation layer and each semiconducting pillar;
   depositing a fifth dielectric layer so as to fully cover the first conductive layer;
   etching the fifth dielectric layer so as to bare a plurality of portions of the first conductive layer forming caps, and to retain a residual thickness of the fifth dielectric layer, each cap covering an upper portion of each semiconducting pillar;
   etching the first conductive layer and the fifth dielectric layer so as to remove each cap and the residual thickness of the fifth dielectric layer;
   etching the first conductive layer so as to obtain the coupling rows.

9. The method according to claim 1, comprising, before etching the first monocrystalline semiconducting layer, forming a plurality of protective pads on the first semiconducting layer, etching the first semiconducting layer comprising anisotropically etching a first part of the first semiconducting layer so as to obtain a semiconducting pillar under each sacrificial pad.

10. The method according to claim 8, comprising, after etching each portion of the flank dielectrics:
    removing the protective pad from each semiconducting pillar so as to expose the head of said semiconducting pillar; and
    depositing a doped conductive layer forming an initialisation layer, covering at least the second end and the contact surface of each semiconducting pillar.

11. The method according to claim 10, wherein the initialisation layer is made of heavily doped polycrystalline silicon.

12. The method according to claim 8, comprising, after etching each portion of the flank dielectrics:
    forming a plurality of third doped conductive electrodes forming readout rows, each readout row being in contact with at least one semiconducting pillar;
    depositing a sixth dielectric layer forming a fourth separation layer, covering the readout rows and covering the plurality of protective pads;
    planarising the fourth separation layer and the plurality of readout rows until the protective pads are reached;
    selectively etching the plurality of protective pads so as to leave a plurality of cavities vertically aligned with each semiconducting pillar; and
    forming a gate structure forming a charging gate, in each cavity.

13. The method according to claim 12, wherein each readout row is in contact with the contact surface of at least one semiconducting pillar.

14. A quantum electronic circuit to be obtained by the implementation of the manufacturing method according to claim 1.

* * * * *